United States Patent
Sueyoshi

(10) Patent No.: US 7,324,335 B2
(45) Date of Patent: Jan. 29, 2008

(54) DISK ARRAY SYSTEM

(75) Inventor: Junya Sueyoshi, Odawara (JP)

(73) Assignee: Hitachi, Ltd., Tokyo (JP)

( * ) Notice: Subject to any disclaimer, the term of this patent is extended or adjusted under 35 U.S.C. 154(b) by 195 days.

(21) Appl. No.: 11/175,376

(22) Filed: Jul. 7, 2005

(65) Prior Publication Data

US 2006/0262657 A1    Nov. 23, 2006

(30) Foreign Application Priority Data

May 18, 2005   (JP) ............................. 2005-145375

(51) Int. Cl.
G06F 1/16      (2006.01)
H05K 7/00      (2006.01)

(52) U.S. Cl. ................. 361/685; 369/243; 165/104.33; 713/300

(58) Field of Classification Search ............... 369/47.1, 369/243, 30.64; 165/104.33; 710/1; 713/300; 361/679–687, 724–727, 695
See application file for complete search history.

(56) References Cited

U.S. PATENT DOCUMENTS

| | | | |
|---|---|---|---|
| 5,675,816 A | | 10/1997 | Hiyoshi |
| 2005/0270927 A1* | | 12/2005 | Hayashi ..................... 369/47.1 |
| 2006/0039108 A1* | | 2/2006 | Chikusa et al. ............. 361/695 |
| 2006/0149979 A1* | | 7/2006 | Sakakibara et al. ......... 713/300 |

* cited by examiner

*Primary Examiner*—Hung Van Duong
(74) *Attorney, Agent, or Firm*—Mattingly, Stanger, Malur & Brundidge, P.C.

(57) ABSTRACT

In a disk array system, techniques advantageous in terms of economy and maintenance and capable of realizing high-density wiring of data signal wiring and power feed wiring on a backboard, and flexibly implementing specification change, processing performance improvement, etc. are provided according to a DKC mounting method different from conventional ones. In a power feed unit of the backboard, the power feed wiring comprises a bus bar of three-dimensional structure which reserves a gap distance with respect to a face of the backboard. The data signal wiring connecting connectors is provided in an area below the bus bar, thereby providing high-density wiring. The gap distance is formed to meet a design specification which makes the power supply noise influence of the power feed wiring of the bus bar on the data signal wiring satisfactory small. Power feed connectors and locator pins for logical packages are connected on the bus bar.

14 Claims, 11 Drawing Sheets

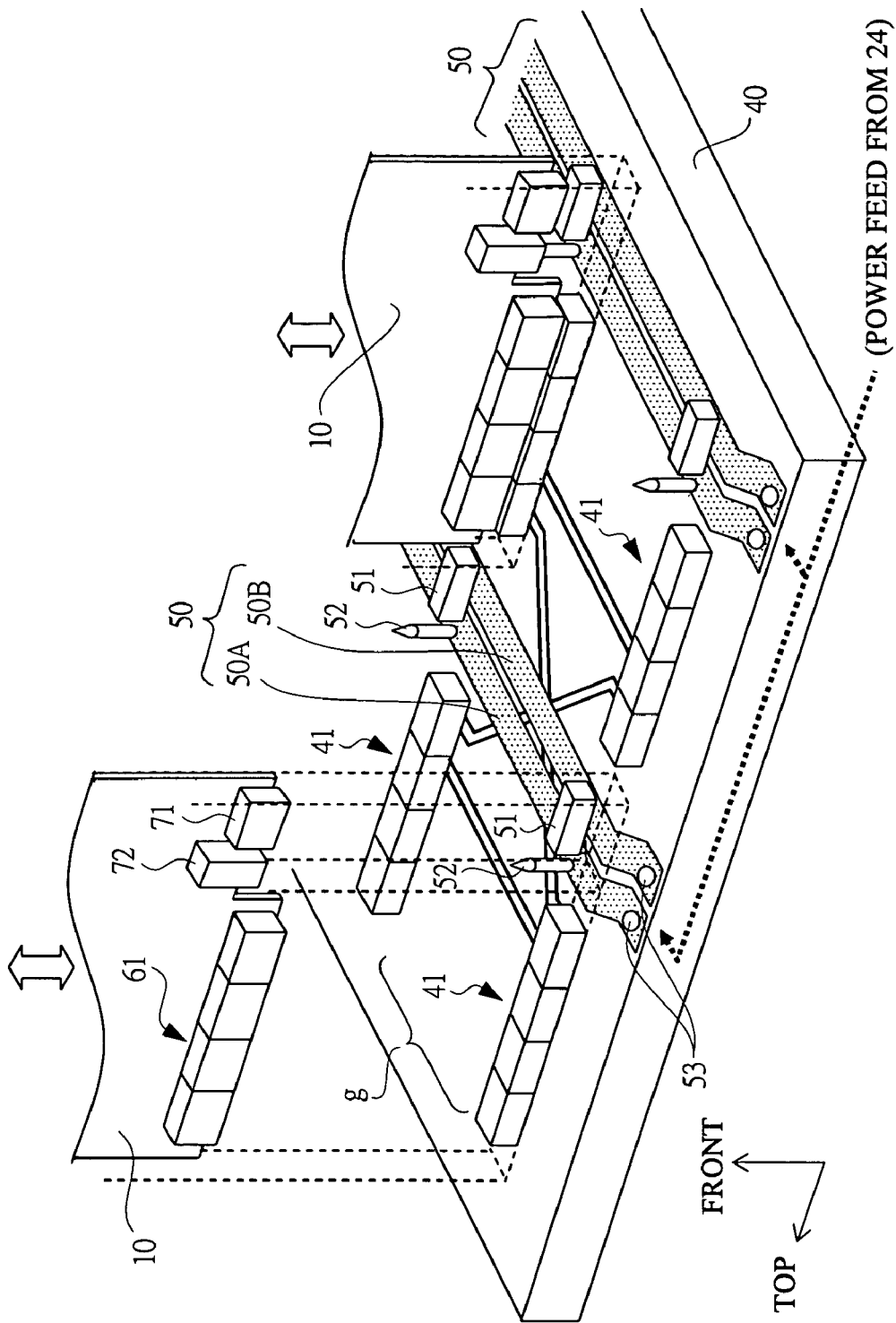

DATA SIGNAL WIRING

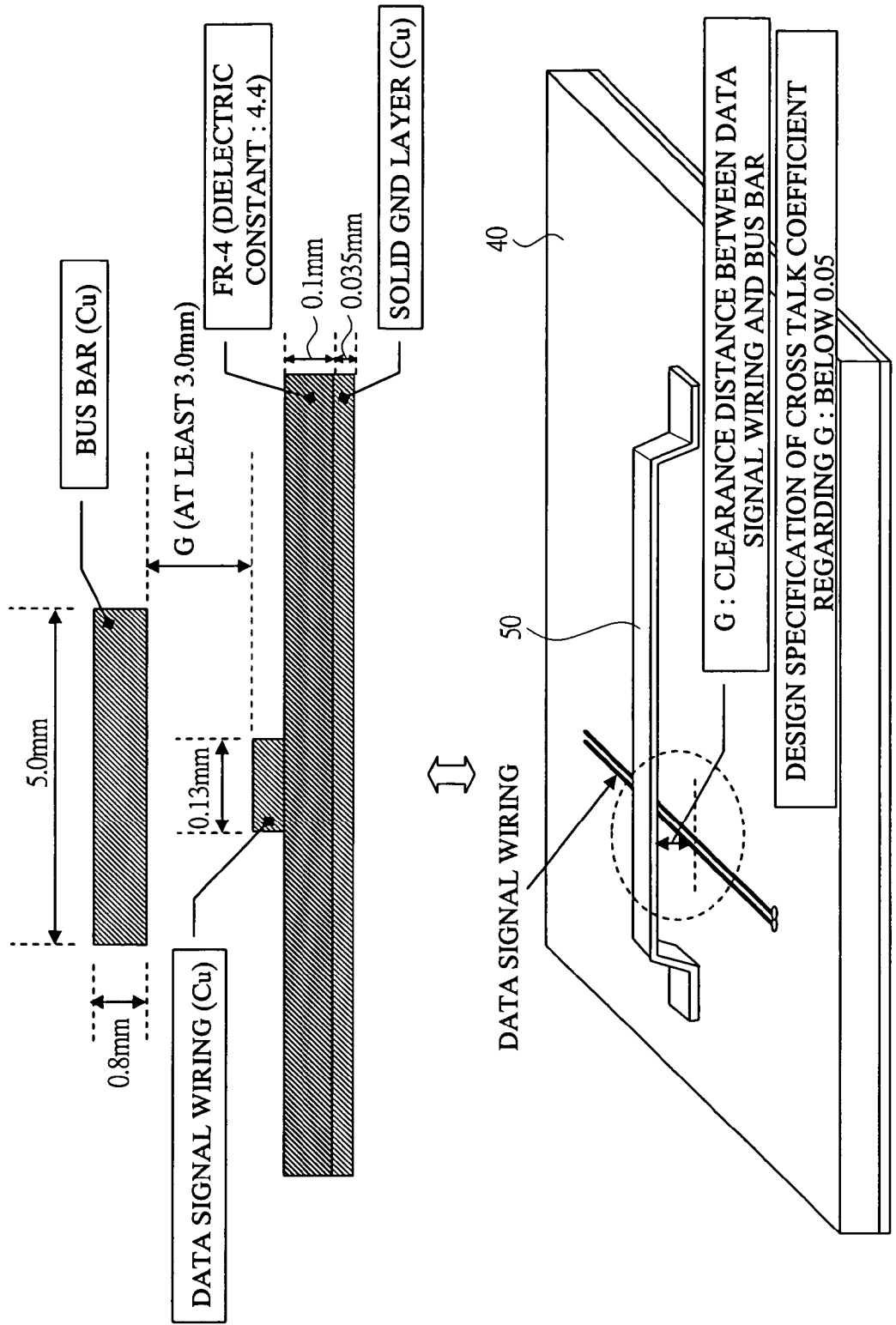

CROSS TALK COEFFICIENT BETWEEN DATA SIGNAL WIRING AND BUS BAR

G : CLEARANCE BETWEEN DATA SIGNAL WIRING AND BUS BAR [mm]

← → : DATA SIGNAL WIRING    ◄···► : POWER FEED WIRING

DISK ARRAY SYSTEM

CROSS-REFERENCE TO RELATED APPLICATION

The present application claims priority from Japanese Patent Application No. JP 2005-145375 filed on May 18, 2005, the content of which is hereby incorporated by reference into this application.

BACKGROUND OF THE INVENTION

The present invention relates to a disk array system which is provided with storage devices such as hard disk drives (HDDs) and a storage control device for controlling storage of data with respect to the storage devices and is capable of performing RAID control. In particular, relates to techniques for mounting, for example, wiring for power feed and data signal on the boards constituting the storage control device.

In a conventional disk array system, the storage control device (DKC) has a configuration in which a plurality of processing-function-installed boards (referred to as logical substrates) provided in a form of, for example, packages (referred to as PKs) is mutually connected to a backboard (also called a back plane board). The above described PK of the logical substrate is referred to as a logical PK. The backboard has connectors and the like for connecting with the plurality of logical PKs, wiring for communication between the logical PKs (referred to as data signal wiring), a power feed unit which includes wiring for power feeding to units such as the logical PKs (referred to as power feed wiring). The logical substrates or logical PKs have connectors and the like for communication and power feed, LSIs serving as processors, data signal wiring, the parts to which power is to be fed, power feed wiring, etc. On the backboard face, the plurality of logical PKs are connected in parallel in the lateral direction.

Meanwhile, in the power supply system, DC (direct current) power is fed from a power source unit of the disk array system to a power feed unit of the backboard. In the power feed unit of the backboard, power feed wiring is provided by use of multiple internal layers of the backboard, and power feed connection with the logical substrates is achieved by power feed connectors. In the power feed unit, through the layers serving as the power feed wiring, DC power is fed to the logical substrates via the power feed connectors of the backboard side and through the logical substrate side. The power feed unit is provided in the vicinity of the outer periphery of the backboard face.

A conventional DKC mounting method requires a configuration in which, in terms of performance of the disk array system, processing functions are multiplexed and mutual communication between the processing function units can be performed. That is, two LSIs and two communication connectors are mounted on one logical substrate. Also, data signal wiring is provided such that each of the LSIs can communicate, via the communication connectors, with both the upper and the lower areas which are provided in the vertical direction on the backboard face. Hereinafter, such wiring connecting from one area to another area will be referred to as cross wiring. In conventional configurations, data signal cross wiring is provided in the logical substrate so as to avoid providing cross wiring in the backboard face.

Japanese Patent No. 3242407 discloses techniques relating to the storage control device and the power source unit.

SUMMARY OF THE INVENTION

Data transfer performance of disk array systems is increasing year by year, and the number of data signal wiring lines is also increasing. At the same time, increase of the supply current in the power supply system is also required. In future disk array systems, for example, increase of the supply current in the power supply system, specification change such as downsizing of the logical PKs, and processing performance improvement are required.

In the above described conventional DKC mounting method, the data signal wiring and the power feed unit are separated in the backboard face. However, for specification change as described above, for example, increase of the wiring and providing another power feed unit in the backboard face are required. Accordingly, the data signal wiring and the power feed wiring have to be located close to each other by, e.g., causing them to intersect with each other or to be provided adjacently with each other in the backboard face.

It is difficult to closely locating the data signal wiring with the power feed wiring due to, for example, influence of power supply noise generated by the power feed wiring with respect to the data signal wiring. In other words, the data signal wiring and the power feed wiring place mounting restrictions on each other. When the data signal wiring and the power feed wiring are to be located near each other, it would be an object to prevent problems of, for example, erroneous signals by suppressing the influence of the power supply noise.

Also, it is difficult to increase the power feed wiring of the backboard internal layers in order to, for example, increase the supply current because of limitation on board manufacturing and cost increase. If specification of the connection of the logical PKs cannot be made uniform in relation to downsizing of the logical PKs, it will be a disadvantage in terms of maintenance.

Due to the above described reasons, in the above described conventional DKC mounting method, high-density wiring of the data signal wiring and the power feed wiring in the backboard cannot be realized. Also, it cannot implement the specification change and the processing performance improvement.

The present invention has been achieved in view of the foregoing problems. And an object of the present invention is to provide techniques for disk array system according to a DKC mounting method other than conventional methods. The techniques are capable of realizing high-density wiring of data signal wiring and power feed wiring on a backboard; flexible to the above described specification change and processing performance improvement; and advantageous in terms of economical efficiency and maintenance.

Summary of typical elements of the invention disclosed in the present application will be simply described as below. In order to accomplish the above described object, a disk array system of the present invention is a system which is capable of performing RAID control and provided with storage devices such as HDDs, storage control device (DKC) for controlling storage of data with respect to the storage devices, and a power source unit for feeding power to units such as the storage control device, and is characterized by being provided with technical means as described below.

(1) The present disk array system employs a below described mounting method of a storage control device (DKC). The storage control device (DKC) comprises a first board (backboard) serving as a platter for mutual connection, and a plurality of second boards (logical substrates)

connected to the first board via connectors, etc. for communication wherein in each of the second boards installed is a processing function. DC power is fed from the power source unit to a power feed unit of the first board, and the power is fed into the second boards via power feed wiring and the connectors, etc. for communication in the power feed unit of the first board. This is the DKC mounting method capable of providing data signal cross wiring on a face of the first board. Part or the entirety of the power feed wiring of the power feed unit of the first board comprises a bus bar comprising a three dimensional structure which reserves a gap distance therefrom to the face of the first board. The bus bar is produced by, for example, forming of a frame made of a conductive material such as copper. By virtue of the configuration in which the power feed wiring, etc. are kept away from the face of the first board by the bus bar, the data signal cross wiring, etc. can be provided on the face of the first board in the open area below the bus bar.

(2) In the present system, furthermore, the first board has first connectors for connecting the second boards such that data communication can be performed therethrough, second connectors (power feed connectors) for connecting the second boards such that power feed can be performed therethrough, data signal wiring between the first connectors, and a power feed unit including power feed wiring connected with the second connectors. In addition, the second board has a third connector connected with the first connector of the first board, a fourth connector (power feed connector) connected with the second connector, for example, a processor, a memory, and other control circuits comprising, for example, semiconductor integrated circuit device for implementing the processing function, data signal wiring between the third connector and the processor, and power feed wiring between the fourth connector and a part to which power is to be fed. Power is fed to the second boards through the power feed wiring in the power feed unit and via the second connectors and the fourth connectors; and in the second board, power is fed to the part to which power is to be fed through power feed wiring. A part or the entirety of the power feed wiring of the power feed unit of the first board comprises a bus bar comprising a three-dimensional structure which reserves a gap distance therefrom to the face of the first board such that it does not come in contact with the face of the first wiring except for connecting parts therewith.

The second board is, for example, a channel control unit (CHA) for implementing communication interface processes with an external device, a disk control unit (DKA) for implementing communication interface processes with the storage device, a cache memory (CM) for data cache, and a shared memory (SM) for control information storage. The plurality of second boards are mutually connected by a connector unit including data signal wiring such that communication can be mutually performed therebetween.

(3) In the present system, furthermore, the gap distance (height size) between the three-dimensional structure of the bus bar and the face of the first board is reserved so as to fulfill a specification of a cross talk coefficient regarding power supply noise from the power feed wiring of the bus bar main body to the data signal wiring, that is, so as to sufficiently suppress influence of the power supply noise and prevent erroneous signals. The clearance distance corresponding to at least a value which is calculated according to a specification of materials and sizes (e.g., width and thickness) of the first board, the bus bar, and the data signal wiring, for example, at least 3.0 mm is reserved.

In addition, on the face of the first board, at least one power feed unit is provided in the vicinity of a center thereof in a vertical direction and between both end (outer peripheral) portions thereof in a lateral direction. The data signal wiring (cross wiring) is provided on the face of the first board so as to cross the bus bar of the power feed unit at a level below the bar and connect the first connectors mutually, and a face of the bus bar of the power feed unit is three-dimensionally provided between the both end portions in the lateral direction with the gap distance provided between the face of the bus bar and a face of the data signal wiring. By providing the power feed unit in the face (except for outer peripheral portions) of the first board, downsizing of the logical PKs can be implemented.

(4) In the present system, furthermore, on the upper face of the bus bar, one or more second connectors are connected and fixed at positions corresponding to the connection with the fourth connectors of the second boards. Power is fed from the power source unit to the end portion of the bus bar, and the power is fed from the end portion of the bus bar to the parts to which power is to be supplied in the second boards through the bus bar main body serving as the power feed wiring and via the second connector, which are connected and fixed, and the fourth connectors connected thereto.

In addition, the bus bar is connected and fixed to, for example, outer peripheral part (frame part) of the face of the first board by portions of the bus bar, for example, both end portions by means of, for example, screw fastening so as to obtain the three dimensional structure. In addition, the bus bar is in power feed connection with the first board by a part thereof, for example, the both end portions, and power is fed from the power source unit. In addition, part of the bus bar is connected for power feeding with the second connectors. The part except those which are connected for power feeding is insulated. The power feed unit comprises, as the bus bar, two or more bus bars corresponding to a ground and various types of power sources. Increase of the supply current is handled by a configuration in which the total cross sectional area of the bus bars is changed by addition or replacement of the bus bars.

Furthermore, structures for locating the connecting positions of the connectors between the boards are provided. In the power feed unit, locator pins for improving connecting position accuracy of the connectors of the first board side and the connectors of the second board side are connected and fixed on the bus bar corresponding to the ground. Locator pin receivers are attached to the second boards at the positions corresponding to the locator pins.

Furthermore, in the method, the second connectors and the locator pins are connected and fixed on the face of the bus bar by means of screw fastening. Merely either one of them may be connected and fixed by means of screw fastening.

Furthermore, the second board has a structure in which a cut portion having a shape corresponding to a three dimensional structure formed by the first connector on the face of the first board, the bus bar, and the second connector and the locator pin connected and fixed thereto is provided. By virtue of the cut portion, the amount of the gap distance is cancelled in the connection between the first board and the second boards, thereby stably engaging the connectors.

Furthermore, a spacer made of an insulating material such as plastic for ensuring positioning accuracy and reinforcement property of the bus bar is connected and fixed between the face of the first board and a face of the bus bar by means of screw fastening. By virtue of accuracy of the bus bar size and connection and fixing of, for example, the spacer, bus bar position accuracy in the vertical and horizontal directions including the gap distance can be ensured.

(5) The present system is further according to a method in which the plurality of second boards is connected in the same direction. The second boards are provided in a form of, for example, packages having a structure for inserting and removing themselves with respect to the first board. The face of the first board includes a plurality of areas divided with respect to the vertical direction, for example, upper and lower two areas each of which has the power feed unit and a connection area with the second boards including the first connectors and the second connectors on the bus bar. The plurality of the second boards is inserted with respect to the connection area so as to be connected thereto in parallel in the lateral direction of the face of the first board via the first to fourth connectors with respect to slots; and the plurality of second boards is inserted with respect to the slots and the connection area in the same direction in the vertical direction of the face of the first board so as to be connected thereto.

Furthermore, the system is according to a method in which the second boards which have been divided into halves compared with conventional ones are connected such that mutual communication can be performed therebetween. Data signal simple wiring is provided in the second board between the third connector and the processor. Meanwhile, on the face of the first board, data signal cross wiring is provided so as to mutually connect the first connectors between the upper and lower areas for mutual communication between the second boards.

Furthermore, for example, the system is according to a method in which a switch board in which a path switching control function (switching unit) for mutual communication between the second boards is installed is provided as one type of the second boards so as to form the connector unit. For example, in each of the upper and lower areas of the face of the first board, the switch board and several second board corresponding to other processing functions (e.g., above mentioned CHA, DKA, CM, and SM) are connected by the data signal wiring. Furthermore, between the upper and lower areas of the face of the first board, the switch boards are mutually connected by the data signal cross wiring crossing the power feed unit.

(6) Another disk array system of the present invention is characterized by providing the power feed wiring on the second board by the three dimensional structure of the bus bar. Power is fed from the power source unit to the power feed unit of the first board, and the power is fed to the second boards through the power feed wiring in the power feed unit. In the second board, part or the entirety of the power feed wiring from the fourth connector to the part(s) to which power is to be fed comprises a bus bar comprising a three dimensional structure which is produced by, for example, forming of a frame of a conductive material and reserves a gap distance therefrom to the face of the second board, and the data signal wiring is reserved on the face of the second board below the face of the bus bar.

Effects obtained by typical one of the present inventions disclosed in the present application will be simply described as the following. According to the present invention, according to a DKC mounting method different from conventional ones, a disk array system which is capable of realizing high-density wiring of the data signal wiring and the power feed wiring on the backboard, flexibly implementing the above described specification change, processing performance improvement, etc., and is advantageous in terms of economical efficiency and maintenance can be provided.

Particularly, erroneous signals of data signals can be prevented and stable power feed with an impedance which is lower than that in board wiring can be performed, by employing, in a disk array system which is according to a specification of increased supply current, a design specification which sufficiently suppresses the influence of power supply noise by reserving a gap distance between the power feed wiring of the bus bar and the data signal wiring on the backboard face. Increase of power feed current can be also flexibly implemented by using a configuration in which the cross sectional area of the bus bar is changed.

Particularly, in a disk array system which is according to a specification of downsized logical PKs, erroneous connection can be prevented and advantages in terms of maintenance are also achieved, since, for example, logical PKs which are divided into halves compared with conventional ones and according to a uniform specification can be realized, and the logical PKs can be inserted in the same direction.

BRIEF DESCRIPTIONS OF THE DRAWINGS

FIG. 6 is a perspective view showing a state of connection of the logical packages with the backboard in the disk array system of the first embodiment of the present invention;

FIG. 9 is a drawing showing a simulation model for examining the influence of power supply noise corresponding to the distance between the bus bar serving as power feed wiring and data signal wiring in the disk array system of the first embodiment of the present invention;

DESCRIPTION OF THE PREFERRED EMBODIMENTS

Figure 10:
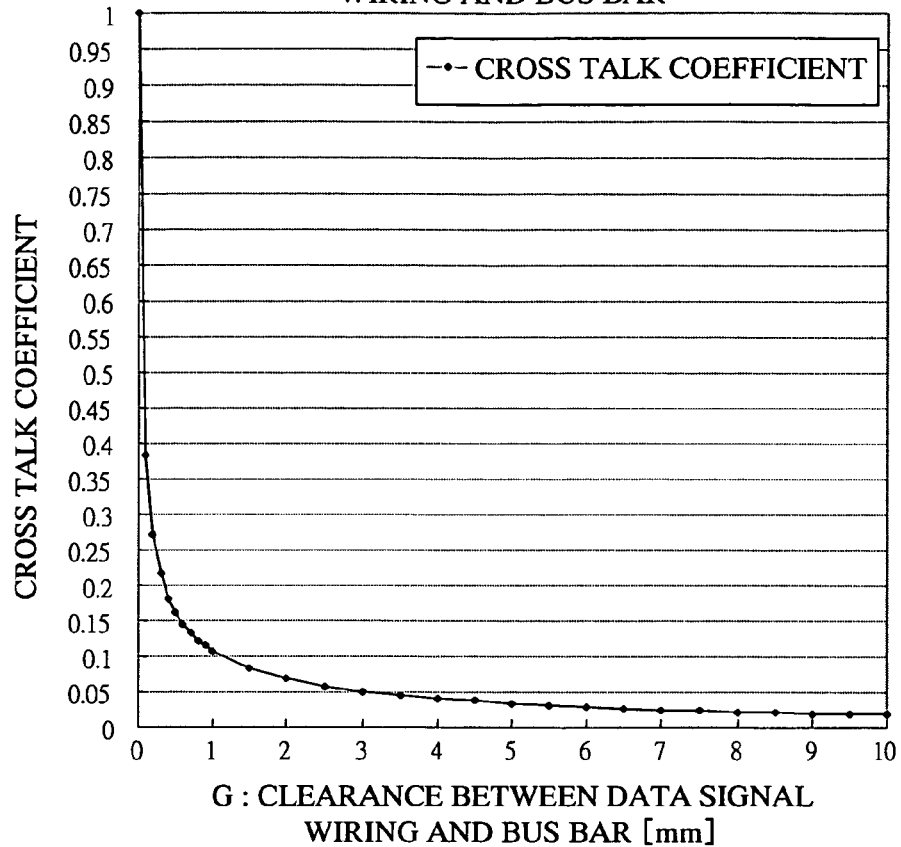
FIG. 10 is a graph showing cross talk coefficients corresponding to the gap distances according to the simulation model of FIG. 9 in the disk array system of the first embodiment of the present invention.
Figure 11:
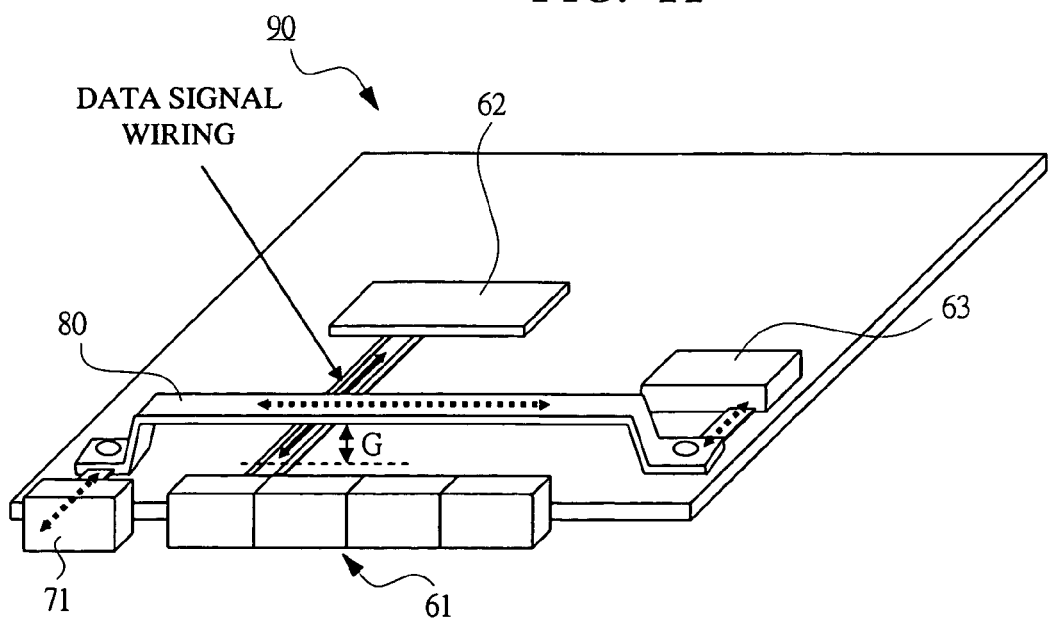
FIG. 11 is a drawing showing a configuration of a logical package in a disk array disk system of another embodiment of the present invention.
Figure 12:
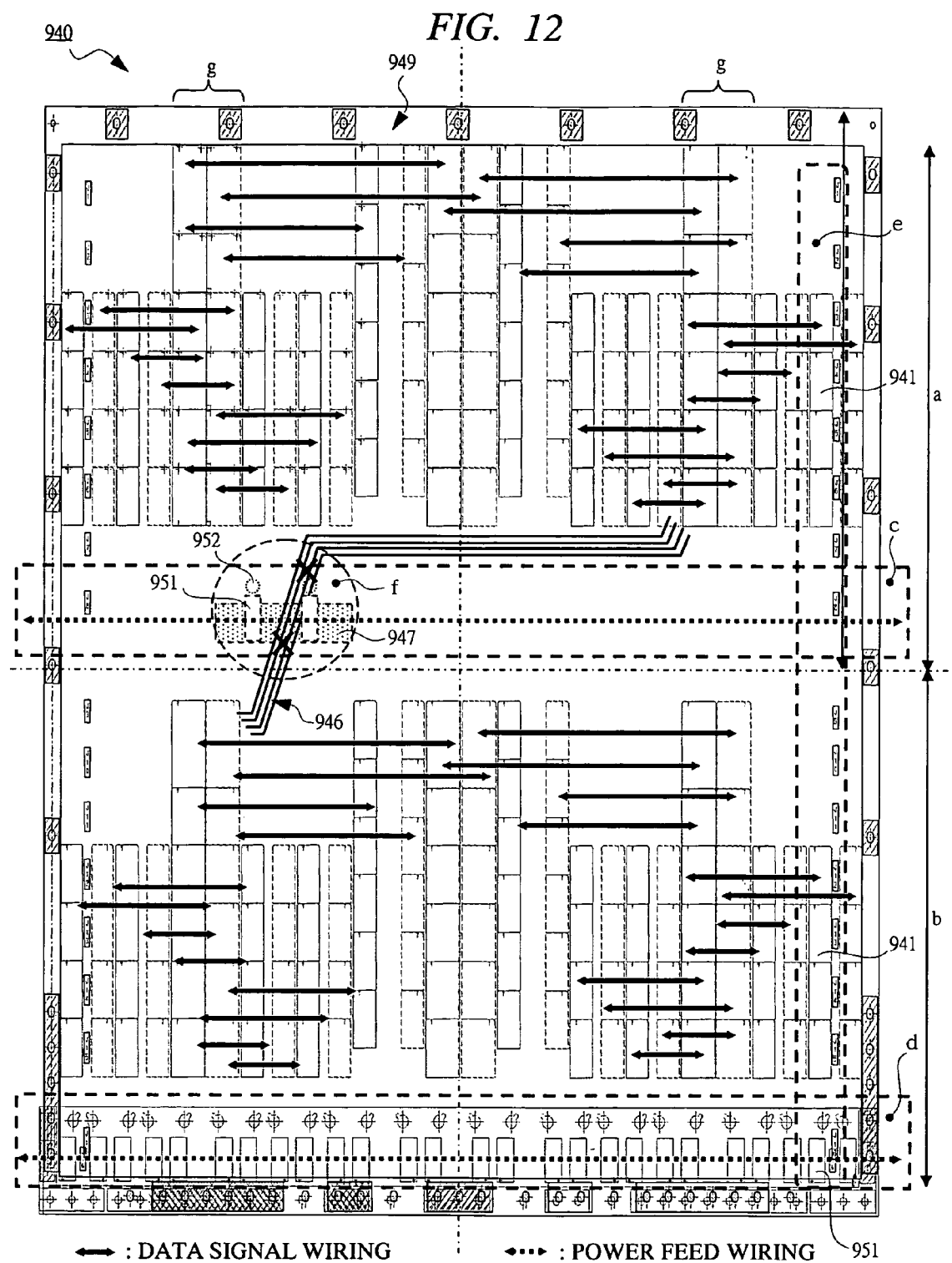
FIG. 12 is a drawing showing an example of a mounting configuration of a backboard in a conventional disk array system.
Figure 13:
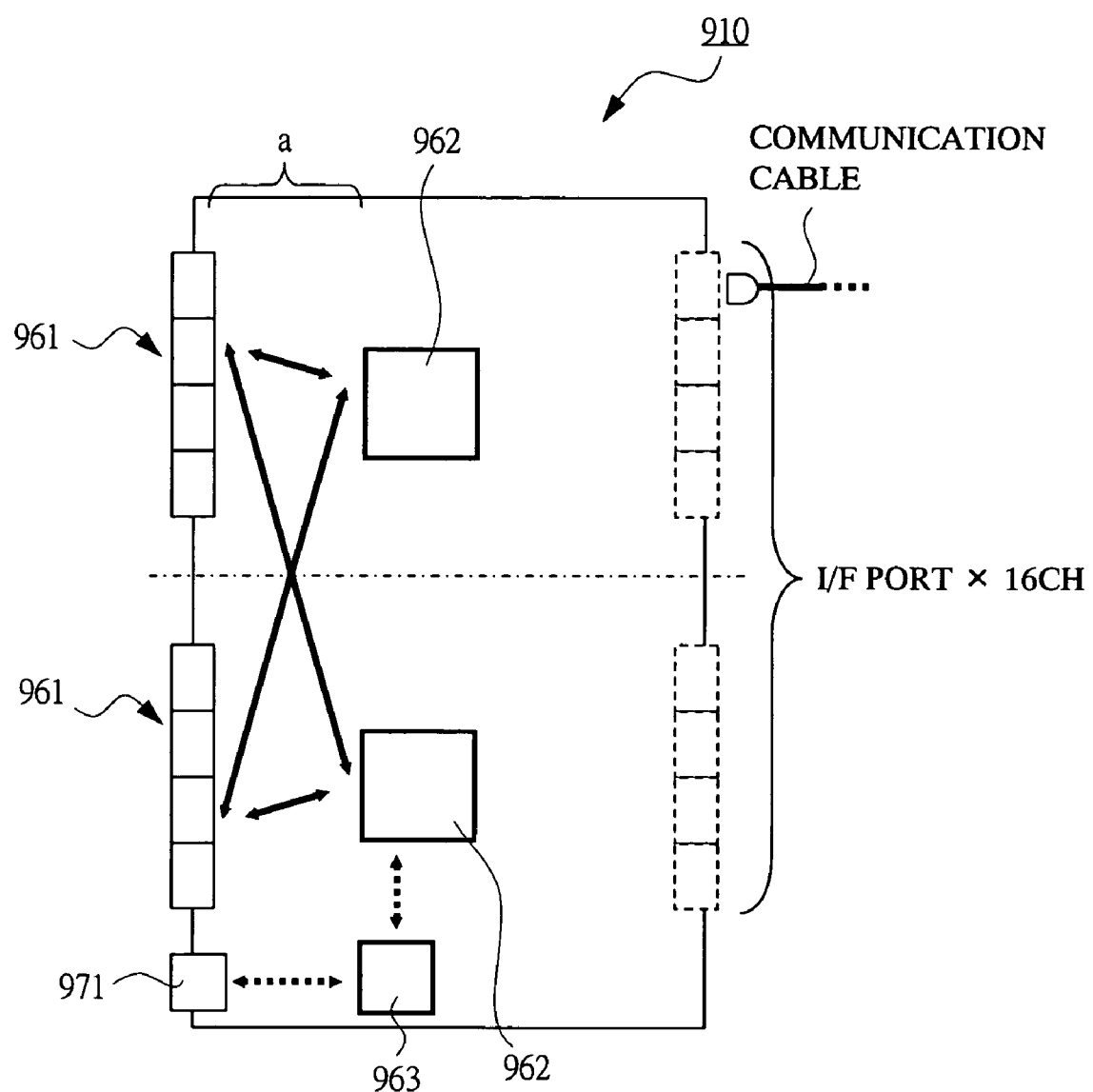
FIG. 13 is a diagram showing a configuration of a logical package which is corresponding to the configuration of the backboard shown in FIG. 12 in the conventional disk array system.

Hereinafter, embodiments of the present invention will be described in detail with reference to drawings. In all the drawings for explaining the embodiments, same parts are basically denoted by the same reference numerals, and repeated descriptions thereof are omitted. FIGS. 1 to 11 are drawings for explaining a disk array system of the present embodiment. FIGS. 12 and 13 are drawings for explaining a conventional disk array system for comparison with the present embodiment.

<Outline>

A disk array system 1 of a first embodiment of the present invention is configured such that a plurality of same-type logical PKs (10) is connected in parallel in the lateral direction on both sides of a backboard (40) in a DKC (100). The configuration is corresponding to a system in which, in the vertical direction, two logical PKs (10) which are uniformly oriented can be inserted to and removed from upper and the lower areas ("a" and "b") of the face of the backboard (40). In this configuration, a power feed unit in the backboard (40) comprises a bus bar (50) having a three dimensional structure, and power feed wiring in the backboard (40) face is eliminated. In an area under the bus bar (50), data signal wiring (cross wiring) and an open area are provided. The connected logical PK (10) is in a form which is half of that of a conventional configuration. As data signal wiring, the logical PK (10) side has simple wiring, and the backboard (40) side has cross wiring between the upper and the lower areas ("a" and "b"). Corresponding to the three-dimensional structure of the bus bar (50), a cut portion (70) is provided in the logical PK (10) side. In addition, power feed connectors (51) and locator pins (52), which are of a type that can be connected and fixed to the bus bar (50) by means of screw-fastening. With consideration for influence of power supply noise, a gap distance between the data signal wiring on the backboard (40) face and the bus bar (50) is secured and positioning accuracy is ensured by inserting spacers (45).

<Conventional DKC>

First, in comparison with the present embodiment, a mounting configuration example of a DKC of a conventional disk array system will be described. FIG. 12 shows an example of a mounting configuration of a conventional backboard 940. FIG. 13 shows an overview of a configuration of a logical PK 910 which is connected to the backboard 940 of the type of FIG. 12. In FIG. 12, one side of the backboard 940 is shown, and the other side thereof also has the same configuration. The configuration of the backboard 940 will be described by broadly dividing it into an upper-half area "a" and a lower half area "b", except for a frame part 949. The area "a" includes an area which has connectors and the like and data signal wiring, and an open area "c" which is located in the vicinity of the center in vertical direction of the backboard 940 face. The area "b" includes an area which has connectors and the like and data signal wiring, and an area "d" of a power feed unit which is in the vicinity of the lowest side of the backboard. A case wherein a power feed unit is provided in the area "c" will be described later. An area "e" shows an example of a connecting position of the logical PK 910. An area "f" represents a partial area of a case in which a power feed unit similar to that of the area "d" is provided and data signal wiring are provided in the area "c". Areas "g" represent connecting positions of the logical PKs, particularly, connecting positions of the PKs serving as switching units. Solid-line arrows represent data signal wiring or a substrate layer corresponding thereto. The data signal wiring includes various wiring such as those for input/output data transfer or control information communication. Dotted-line arrows represent power feed wiring or a substrate layer corresponding thereto. The power feed wiring shows wiring of a ground and various types of power sources collectively as one wiring.

The data signal wiring shown in FIG. 12 is provided to correspond to a DKC mounting system which is performed by mutual connection of the logical PKs 910. Particularly, the data signal wiring is provided to correspond to a bus type in which logical substrates/PKs are mutually connected via logical substrates/PKs which are serving as switching units (SW) (hereinafter, referred to as switch PK). The present bus type is, for example, as shown in a left half area of the upper area "a", a type in which a plurality of other logical substrates (910) having functions of, for example, channel control units is connected to connector positions of the switch PKs as shown by the areas "g" via buses, i.e., data signal wiring and in which communication between the logical substrates (910) is performed by path switching control at the switch PKs (910). Connectors are represented by rectangles and the details thereof such as pins are omitted.

In the areas "a" and "b", the data signal wiring is provided in a form of lateral straight line between connectors, and data signal wiring (cross wiring) is not provided between the upper and the lower areas "a" and "b". The open area "c" in the vicinity of the center is used when wiring between the areas "a" and "b" is to be provided.

The area "d" of the power feed unit is a portion for feeding DC power to the logical PKs 910 via power feed connectors (951). In the area "d", internal layers of the backboard 940 include a power layer which serves as power feed wiring. In the area "d", multiple internal layers of the backboard 940 are used in wiring, and power feed connection with the logical PKs 910 is performed through the power feed connectors (951). For example, in the internal layers of the backboard 940, ground layers and layers of various types of power sources are alternately provided. DC power is fed from a power source unit of the disk array system to the power feed unit of the backboard 940. Then, the DC power is fed to the logical PKs 910 through the power feed wiring (power layer) of the power feed unit of the backboard 940, and via the power feed connectors (951) and power feed connectors (971) of the logical PK 910 side.

The area "e" includes main edge connectors (also simply referred to as connectors) 941 which are relevant to data signals, and the power feed connector 951 which is relevant to power feed to the logical PK 910. This connecting position includes two connectors 941 and one power feed connector 951. In this configuration, the data signal wiring on the backboard 940 face is completely separated from the area "d" of the power feed unit which is in the vicinity of the lower side. In the vertical direction of the backboard 940 face, one logical PK 910 is connected via each of the connectors 941 of the upper and the lower areas "a" and "b" and via the power feed connector 951. And, a plurality of the logical PKs 910 is similarly connected in the lateral direction.

In FIG. 13, the logical PK 910 includes units to which power is to be fed, such as two series of main edge connectors (connectors) 961, one power feed connector 971, two LSIs (integrated circuit devices) 962, data signal wiring (cross wiring), power feed wiring, and a DC-DC converter 963. In addition, for example, if the logical PK 910 is a PK as functions of a channel control device, the logical PK 910 is provided with I/F ports as shown by dotted lines. For example, 16 channels of I/F ports are provided per package. A communication cable is connected to the I/F port, thereby enabling communication between this logical PK 910 and an external device. Other logical PKs 910 are also provided with other necessary units such as memories, etc. in accordance with the processing function thereof. Except for the power supply system, upper and lower areas in the logical PK 910 have a configuration of similar functions.

In the DKC mounting system, in order to ensure the performance and reliability of the disk array system, two LSIs 962 serving as processors are mounted on one logical PK 910, and as shown in an area "a", the data signal wiring is installed in a form of cross wiring between the two processors of the upper and the lower areas. That is, through the cross wiring, each of the LSIs 962 of each PK 910 can communicate with other processors which are corresponding to either position of the upper or lower area "a" or "b" of the backboard 940. Cross wiring is provided in the area "a" of the logical PK 910 side, and cross wiring between the upper and lower areas "a" and "b" in the backboard 40 side is avoided.

In FIG. 12, if it is supposed that a power feed unit and data signal cross wiring are provided in the area "c", the area "f" has a power layer 947 serving as power feed wiring provided in the internal layers of the backboard 940 and power feed connectors 951 provided at several positions on the power layer 947. In addition, a locator pin 952 is provided beside the power feed connector 951. Moreover, data signal wiring 946 crossing the power feed wiring between the upper and lower areas "a" and "b" is provided. The data signal wiring 946 shows an example of cross wiring which connects between the connectors of the upper and lower areas "a" and "b".

However, in practice, in the area "f", the power layer 947 serving as a power supply layer and the data signal wiring 946 interfere with each other in terms of space, and influence of power supply noise exerted by the power layer 947 on the data signal wiring 946 becomes excessively strong. Therefore, such wiring mounting system is difficult and disadvantageous. Also, particularly in a case wherein the locator pins 952 are also provided, the data signal wiring has to be installed in a gap between the spaces necessary for installing the locator pins 952. Therefore, it is difficult to provide sufficient wiring. If it is supposed that power feed wiring is provided in the backboard face in an area other than the area "c" near the center, the wiring area disturbs data signal wiring.

It is conceivable that, in the area "c", cross wiring of data signal wiring may be preferentially made and the number of power layers in the backboard internal layers may be increased in accordance with the increase of the supply current so as to provide power feed wiring.

As the above described specification change, the supply current in the power supply system is increased in order to increase the working current for improving the performance, or to cause the system to be that of a type corresponding to a generally required power supply voltage. Downsizing of the logical PK is required in terms of, for example, cost or to implement a minimum essential configuration. For example, that is in order to provide a minimum essential configuration of, for example, a minimum channel number which is required by customers.

As a result of the above described increase of the supply current, the power feed wiring of the power feed unit is increased. Therefore, it is conceivable that layers of the power feed wiring in the backboard internal layers may be increased. However, increasing the number of substrate internal layers is expensive and it causes a problem in terms of cost. And it is difficult to realize the increase due to limits of manufacturing.

In downsizing of the logical PK, for example, the size of a conventional logical PK is reduced to about half thereof, and, also in terms of functions, it is configured to comprise simple wiring of data signal wiring between one LSI and a connector for communication (referred to as division into halves). In this case, for example, in an area near the center of the backboard, a power feed unit which includes power feed wiring, power feed connectors, etc. are required to be newly provided, and data signal cross wiring on the backboard face is also required to be provided. In order to improve data transfer performance, the number of data signal wiring lines and the number of power feed wiring lines have to be increased.

When a power feed unit is to be provided in an area in the backboard face, for example, when it is provided in an area near the vertical center thereof, the power feed wiring thereof places restrictions on data signal wiring. Therefore, the number of data signal wiring lines cannot be increased, and high-density wiring cannot be realized. Particularly, cross wiring between the upper and the lower areas cannot be realized. Accordingly, the division of the logical PK into halves also cannot be realized. In addition, if the data signal wiring cannot be increased, performance improvement cannot be implemented either.

Conversely, when data signal wiring is prioritized to be provided in the area on the backboard face, the data signal wiring places restrictions on power feed wiring. Therefore, the number of power feed wiring lines cannot be increased, and high-density wiring cannot be realized. Particularly, power feed wiring in the area near the center cannot be realized. Accordingly, the division of the logical PK into halves cannot be realized either. In addition, if the power feed wiring cannot be increased, increase of the supply current cannot be implemented.

While in the present embodiment, as shown in later mentioned FIG. 6, the above described problems are solved by realizing power feed wiring on the backboard (40) face by the bus bar (50) as a three-dimensional structure.

<Hardware of Disk Array System>

Figure 1:
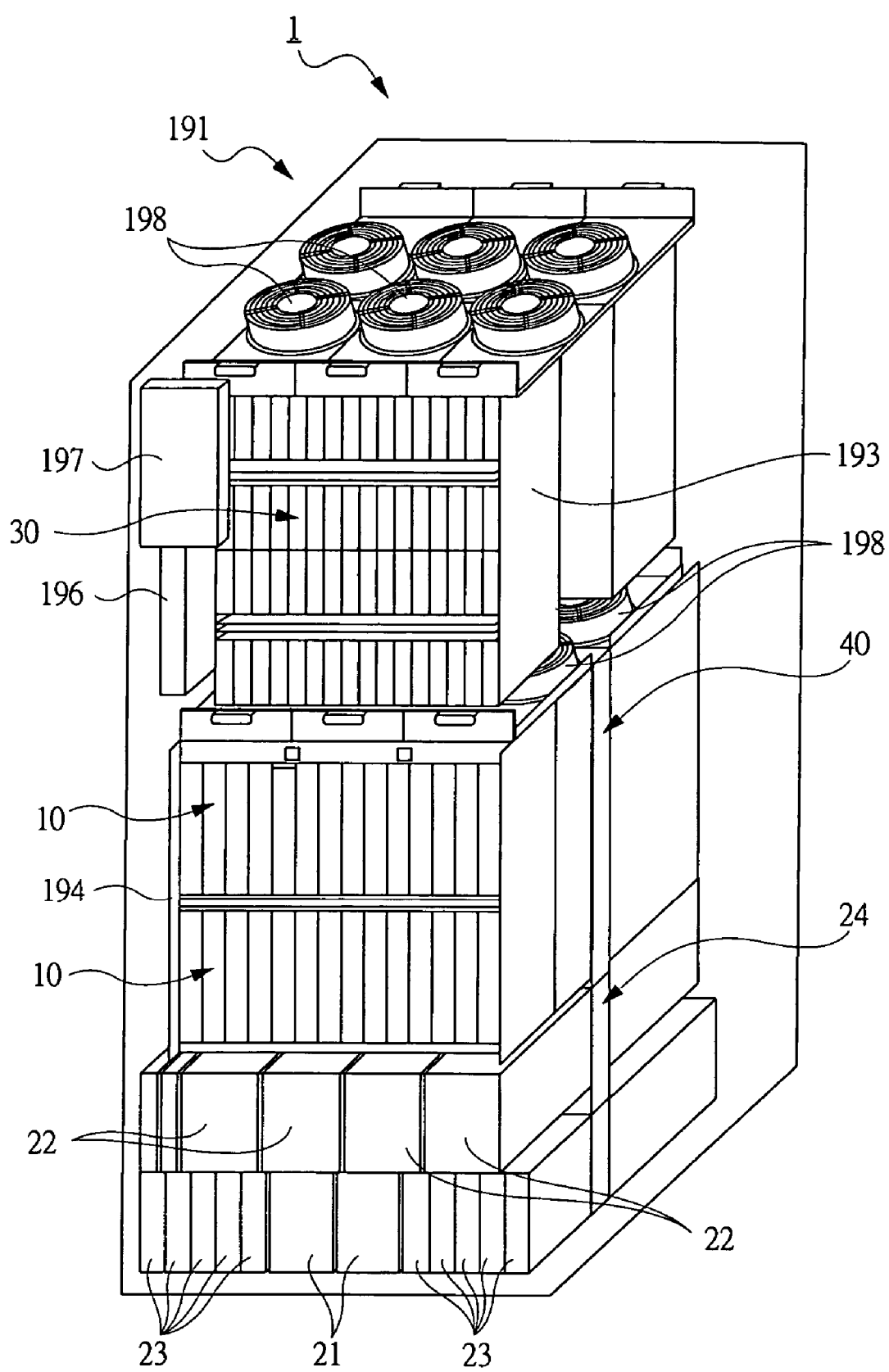
FIG. 1 is a drawing showing an overview of a hardware structure of a disk array system of a first embodiment of the present invention.
Figure 2:
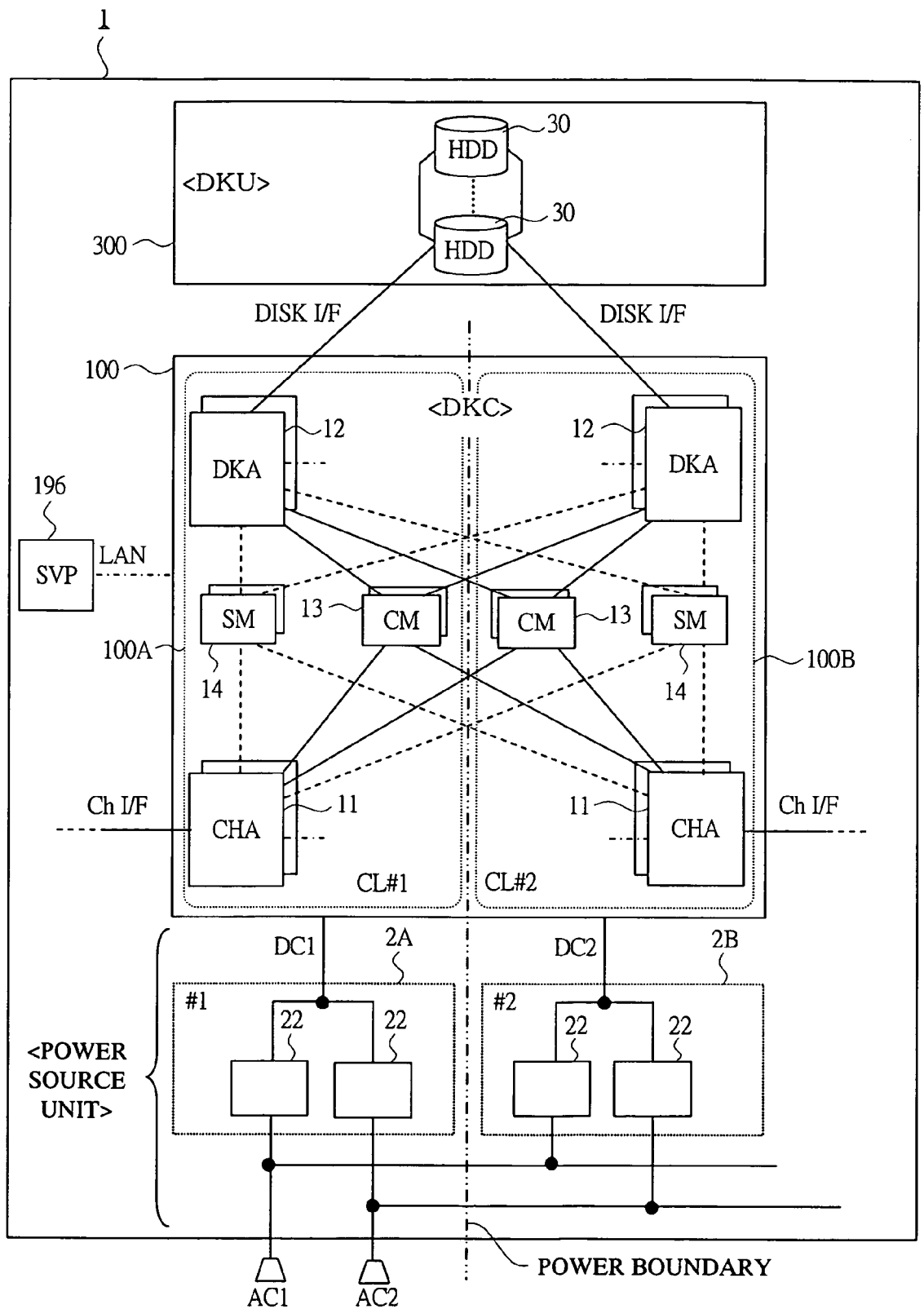
FIG. 2 is a diagram showing a functional block configuration of the disk array system of the first embodiment of the present invention.

FIG. 1 is a perspective view showing external appearance of the hardware structure of the entirety of the disk array system 1. The disk array system 1 comprises, for example, a base chassis and a plurality of expansion chassis. FIG. 1 is a view of the base chassis obliquely viewed from an upper right position in the front thereof in which the chassis is transparently viewed. And FIG. 1 shows an overview of an arrangement of the parts in the chassis. The base chassis is a minimum constituent unit, and is provided with both a storage control function which is implemented by, for example, a DKC 100 as shown in FIG. 2 and a storage function which is implemented by, for example, an HDD 30. The expansion chassis is an option unit, and is provided with a storage function. The storage control function controls, according to requests or orders from other devices such as a host computer which is communicatably connected thereto, storage of data such as user data into a storage area provided by the storage function. The chassis are connected by communication cables such that communication between them can be performed.

The base chassis has, in a frame 191 for housing the units, a power source unit, a DKC unit, a DKU unit, a SVP 196, a panel 197, a plurality of fans 198, etc. The power source unit has a plurality of AC boxes 21, a plurality of AC-DC power supplies 22, a plurality of batteries 23, a power control board (also called a power platter) 24, etc. The DKC unit has a logical box 194, a backboard (also called a logical platter) 40, logical PKs 10, etc. The DKU unit has an HDD box 193, HDDs 30, etc.

In the power source unit, the AC boxes 21 are the units to which input AC power sources are connected, and are connected to the AC-DC power supplies 22 so as to output AC power. The AC-DC power supplies 22 subject the input AC power, which is from the AC boxes 21, to AC-DC conversion, thereby outputting DC power to the power control board 24. The batteries 23 are connected to the AC-DC power supplies 22, so as to serve as backup power supplies upon power failure and also perform memory backup. By use of the DC power from the AC-DC power supplies 22, the power control board 24 feeds the DC power to the units in the system, such as the backboard 40, the HDD box 193, and the fans 198.

In the DKC unit, a plurality of logical substrates, which are corresponding to processing functions and provided in a form of logical PKs 10, is housed in and connected in parallel to the logical box 194 such that each of them can be inserted to and removed from there. The logical PK 10 mainly includes a board (logical substrate) on which a processing function such as that of data control is installed and is integrally made into a module by adding a mechanical structure such as a canister for mounting onto, for example, the logical box 194 and the others. The backboard 40 is provided between front and rear logical boxes 194 of the disk array system. The backboard 40 forms a mutual connection bus which is capable of performing high-speed data communication bidirectionally between the logical PKs 10. The DKC 100 is realized by the mutual connection of the plurality of logical PKs 10 to the backboard 40.

In the DKU unit, a plurality of HDDs 30 which are for storing data and are in a form of HDD units is housed in and connected, in parallel, to the HDD box 193 such that each of them can be inserted to and removed from there. The HDD unit includes the HDD 30 and is also provided with a mechanical structure such as a canister for mounting and the others so as to be integrally made into a module.

The SVP (service processor) 196 is a management terminal device having a processor which handles processes of maintenance and management of the disk array system 1. The SVP 196 has a form of, for example, a laptop PC which is normally housed in the chassis, and is taken out to the front and used when needed. Maintenance personnel and administrators can perform processes of various types of maintenance and management by operating the SVP 196. On the panel 197, for example, switches for the basic operations of the disk array system 1 and a display device for displaying various information are provided. The plurality of fans 198 provided in, for example, an upper part in the chassis carries out air cooling by sending air to the units of the chassis.

<Functional Block Configuration and Information Processing System>

FIG. 2 shows a functional block configuration of the disk array system 1. The disk array system 1 has the power source unit, the DKC (disk controller) 100, the DKU (disk unit) 300, and the SVP 196. In the configuration of the present example, the power source unit and the DKC 100 are correspondingly duplexed. The SVP 196 is connected to each unit of the DKC 100 through an internal LAN.

The DKC 100 has a configuration in which the same function is duplexed by virtue of logical clusters (abbreviated as CLs) #1 (100A) and #2 (100B). A DKU 300 is a unit including a group of the HDDs 30. The CLs 100A and 100B are connected to each of the HDDs 30 of the DKU 300 via a communication network or the like so as to perform communication between them.

A power boundary as shown in FIG. 2 represents a logical boundary which is relating to the power supply system. The power source unit has two systems of power source units #1 (2A) and #2 (2B) for the DKC 100. Since power supply from the power source units to the DKC 100 is duplexed, even if supply of DC power (DC1) from one side of the power boundary, for example, the power source unit #1 (2A) to the CL #1 (100A) stops, supply of DC power (DC2) from the power source unit #2 (2B) in the other side to the CL #2 (100B) is continued. As a result, the functions of the disk array system 1 is kept being provided by the CL #2 (100B). When one of the CLs stops operating, the other CL can take over the process.

External devices such as a host computer and another disk array system are connected to the DKC 100 via a communication means such as a network such that communication can be performed therebetween, thereby forming an information processing system. The host computer is an information processing device which is in a form of, for example, a PC, a workstation, a server, or a mainframe computer which is provided with a CPU, a memory, a communication interface, etc. In the host computer, various functions as a host computer are realized when various programs are executed by the CPU. The host computer is provided with, for example, software for data input/output with respect to the disk array system 1 and an application program for carrying out information processing service by utilizing data input/output with respect to the disk array system 1.

In the DKU 300, each of the HDDs 30 in the DKU 300 is connected to the DKAs 12 of the DKC 100 via a communication network or the like such that communication therebetween can be performed. Corresponding to requests from the DKA 12 side, the HDDs 30 perform operations of reading and writing data from or to the storage areas in the disks thereof. Units of the storage areas in the HDD 30 are, for example, block units which are corresponding to LBAs (logical block addresses). Drives of various I/Fs may be used as the HDDs 30. Storage volumes are set over the HDDs 30 by the DKC 100. The storage volumes refer to storage resources for storing data, including physical volumes which are physical storage areas provided by the HDDs 30 and logical volumes which are storage areas logically set on the physical volumes. The plurality of HDDs 30 forms a disk array which can be provided as a RAID group which is managed according to RAID control.

The SVP 196 is connected to the processors of CHAs 11 and the DKAs 12 via an internal LAN, and can communicate with the processors. The SVP 196 is provided with, for example, a processor, a memory, and a communication unit, and realizes a maintenance/management function by executing programs by the processor. In a mode which can be employed, a management terminal device which is other than the SVP 196 and having a similar function may be connected to the disk array system 1 such that communication therebetween can be performed. For example, a host computer which is connected to and capable of communicating with the disk array system 1 and to which a similar program for maintenance/management processes is installed can be used as the management terminal device. The maintenance/management processing function of the SVP 196 is provided through GUI such that operators can monitor and understand the state of the disk array system 1. The SVP 196 normally perceives various states such as configurations of the units in the disk array system 1, a failure state, and a processing state. According to control information retained in the SMs 14, the SVP 196 displays various state information in a display screen of the SVP 196 through GUI. In addition, when an operator performs an input operation on the SVP 196, information in the SMs 14 can be updated and the state of the disk array system 1 can be updated.

<Power Source Unit>

In accordance with the power boundary, DC power (DC1 and DC2) is supplied from the power source unit #1 (2A) and #2 (2B) to the CLs #1 (100A) and #2 (100B) via the power control board 24. Each of the power source units (2A and 2B) comprises duplex AC-DC power supplies 22, and the AC-DC power supplies 22 are connected to the power control board 24. Power feed wiring of DC power is connected from the power control board 24 to a power feed unit of the backboard 40.

Each of the two systems of the input AC power (AC1 and AC2) is input to the duplex AC-DC power supplies 22 of the power source units (2A or 2B) via the AC box 21. In the power source units (2A and 2B), the input AC power undergoes AC-DC conversion which is performed by the AC-DC power supplies 22, and DC power (DC1 and DC2) is supplied to the corresponding CLs #1 and #2 via the power control board 24. DC1 is supplied to the units constituting the CL #1 (100A), and DC2 is supplied to the units constituting the CL #2 (100B). Although it is not illustrated, DC power is similarly supplied to the DKU 300, etc.

If the batteries 23 are connected to the power source units (2A and 2B), even when DC power supply stops due to power failure or the like of the input AC power (AC1 and AC2), power is supplied from the batteries 23 so as to keep the CLs (100A and 100B) operating for a while.

In power feed between the power control board 24 and the power feed unit of the backboard 40, a structure in which power feed wiring is provided by a bus bar can be formed. For example, through the bus bar, DC power is supplied to power supply pads which are provided on a frame part 49 of the backboard 40. Then, the DC power is supplied from the power supply pads to end portions of the bus bars (50) above the backboard 40 face.

<DKC and Data Input/Output Process>

The DKC 100 has, as processor units having different functions, CHAs (channel control units) 11, DKAs (disk control units) 12, CMs (cache memories) 13, and SMs (shared memories) 14 and the like. In addition, the DKC 100 has connector units for mutually connecting the processor units so as to perform data communication. Each processor unit can be provided in a form of, for example, the above described logical PK 10 or another board. For example, CHA-PKs, DKA-PKs, memory PKs, and switch PKs are provided as the logical PKs. The processor units are connected by the connector units such that control communication and data transfer can be mutually performed therebetween. The processor units are mutually connected via, for example, buses and switching units which are serving as the connector units. The switching unit is provided, for example, by a switch PK, and controls switching of paths for communication between the processor units. The logical PKs 10 are connected to the switch PKs by buses which are serving as data signal wiring. In the DKC 100 in FIG. 2, a configuration in which the switching units are omitted and the processor units are connected by logical paths is shown, wherein solid lines represent data transfer paths and dotted lines represent control communication paths. In a possible mode other than this, for example, the processor units may be directly connected with one another by, for example, data transfer buses and control communication buses.

The CHA 11 has a function of channel I/F for performing data input/output with an external device such as a host computer. The DKA 12 has a function of disk I/F for reading and writing data from or to the HDDs 30 of the DKU 300. Each of the CHAs 11 and the DKAs 12 has a configuration that comprises units such as a processor, a memory, and a processor unit corresponding to the I/F. The processor executes programs so as to realize functions of, for example, the CHA 11. The CHA 11 and the host computer are connected by a path of a host I/F. The DKA 12 and the HDDs 30 are connected by paths of the disk I/F. Each path comprises a physical bus on which a logical path is set in accordance with needs.

The CMs 13 and the SMs 14 are used and shared by the units in the DKC 100. Processed data in the CHAs 11 and the DKAs 12 is transferred via the large-capacity CMs 13. Particularly, the input/output data to or from the storage volumes is subjected to a high-speed data transfer process via the connector units and the CM 13. The SMs 14 are used for storing control information. The CMs 13 and the SMs 14 comprise non-volatile memories and are backed up by the batteries 23. Therefore, even when DC power supply stops, the contents will be retained and not lost. States such as configurations, a failure state, and a processing state of the parts in the disk array system 1 are stored, as needed, in memories such as the SMs 14 provided in the DKC 100 as control information. The processors mounted on the CHAs 11 and the DKAs 12 read and write the control information from or to the SMs 14, as needed. Between the CLs (100A and 100B), for example, the CHA 11 or the DKA 12 can access not only the CM 13 and the SM 14 in the CL to which it belongs, but also the CM 13 and the SM 14 in the CL of the other side.

Between the CLs and in each CL, in order to ensure processing performance and reliability, processor units such as the CHAs 11 are multiplexed, wherein each of the CLs comprises a plurality of the logical PKs 10. The processor units are mutually connected by data signal wiring. When the switching units are provided in the CL, the processor units are connected to the switching units, and the switching units are mutually connected. When the switching units are not provided, the processor units are mutually connected.

Normal data input/output processes in the disk array system 1 flow, for example, as follows. The process of writing/reading data to or from the storage volumes of the DKU 300 which is performed by the DKC 100 according to data input/output requests from the host computer will be described. In the DKC 100, if a request which is from the host computer and received by any of the CHAs 11 is a data write request, the CHA 11 writes a data write request to the SM 14, and writes received write data, which is from the host computer, to the CM 13. Meanwhile, the DKA 12 is monitoring the SM 14, and, when it detects that the data write request has been written to the SM 14, reads out the write data from the CM 13 according to the request and writes it to the corresponding HDD 30. Alternatively, if the data input/output request which is from the host computer and received by any of the CHAs 11 is a data read request, it checks if the data to be read is present in the CM 13. If the corresponding data is present in the CM 13, the CHA 11 reads out the data and transmits it to the host computer. Meanwhile, if the corresponding data is not present in the CM 13, the CHA 11 writes a data read request to the SM 14 as well as monitors the SM 14. The DKA 12 which has detected that the data read request has been written to the SM 14 reads out the data which is to be read from the HDD 30, writes it to the CM 13, and writes about this operation to the above described SM 14. Then, when the CHA 11 detects that the data to be read out has been written to the CM 13, reads out the data and transmits it to the host computer.

The processor units in the DKC 100 may be differently configured. For example, the CM 13 and the SM 14 may be integrally formed to provide a memory structure. Also, other than the configuration in which read and write instructions of data from the CHA 11 to the DKA 12 are indirectly given via the SM 14, there may be employed a configuration in which they are directly given without the intermediation of the SM 14. Also, the CHA 11 may be provided with the function of the DKA 12, thereby enabling the CHA 11 to read and write data from or to the HDDs 30. Also, there may be employed a configuration in which the CMs 13 and the SMs 14 are provided in a manner distributed in the CHAs 11 and the DKAs 12.

<Backboard>

Figure 3:
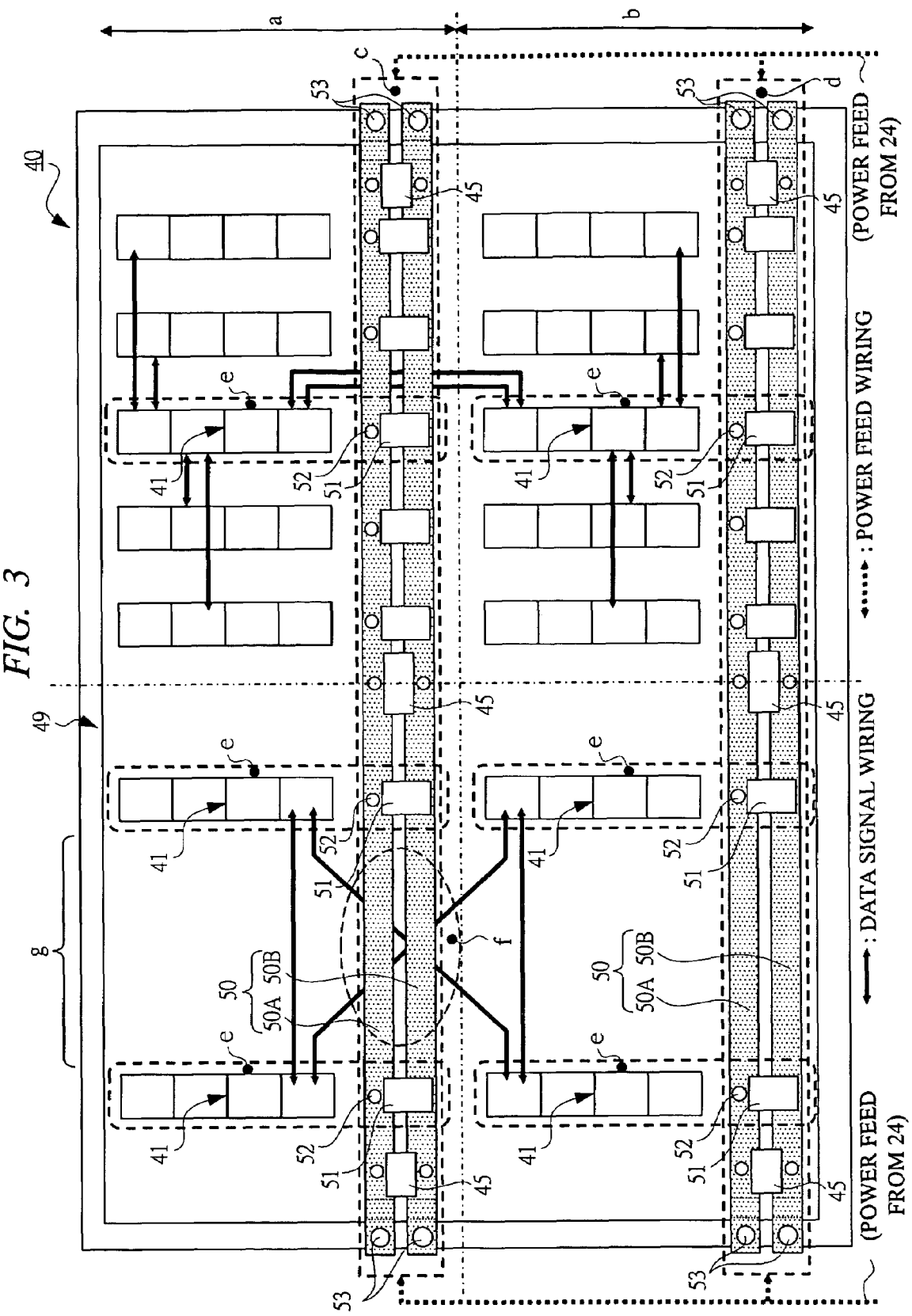
FIG. 3 is a diagram showing a mounting configuration of a backboard in the disk array system of the first embodiment of the present invention.
Figure 4:
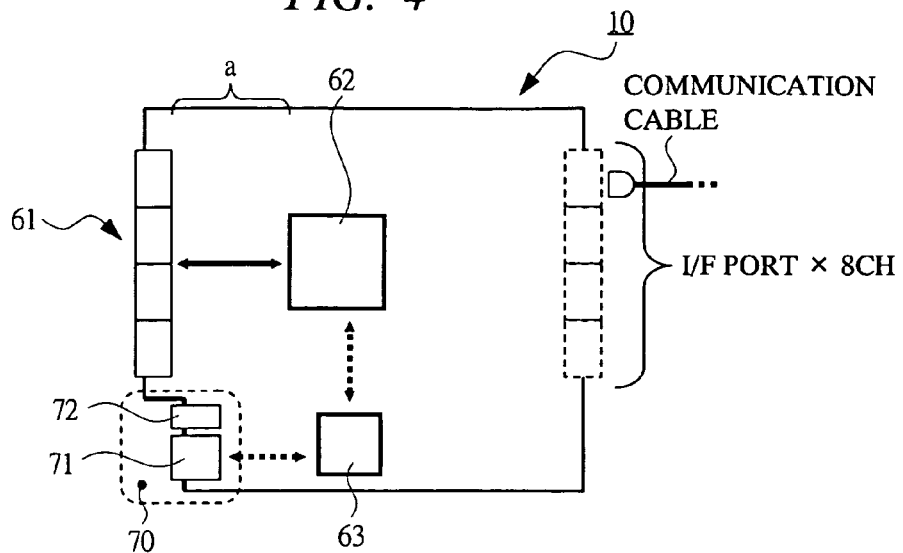
FIG. 4 is a diagram showing a configuration of a logical package in the disk array system of the first embodiment of the present invention.

FIG. 3 shows a mounting configuration of the backboard 40. FIG. 4 shows a brief overview of a configuration of the logical PK 10 which is connected to the backboard 40 of FIG. 3. Although FIG. 3 shows only the front side of the backboard 40, the rear side is configured in a similar manner. In the present embodiment, the upper and the lower areas "a" and "b" of the backboard 40 face are configured in a similar manner. And mounting direction of all of the plurality of logical PKs 10 which are in unified form of outer shape, connector position, etc. is configured to be the same. The right half of the backboard 40 face shows a configuration example corresponding to connection of, for example, ten logical PKs 10 in total. Similarly to the right half, the left half provides a configuration corresponding to connection of multiple logical PKs 10. However, in order to simplify the descriptions, a configuration (corresponding to FIG. 6) corresponding to mutual connection between four logical PKs 10 is shown. Solid-line arrows represent data signal wiring or a substrate layer corresponding thereto. The data signal wiring includes various signal wiring such as that for input/output data transfer or for control information communication, without discriminating them. Dotted-line arrows represent power feed wiring, which is different from the data signal wiring, or represent a substrate layer corresponding thereto. The power feed wiring is shown in one line collecting wiring of grounds and various types of power sources which are corresponding to power supply systems.

In the logical box 194, the backboard 40 and groups of the logical PKs 10 connected to the front and the rear faces thereof constitute the CLs #1 (100A) and #2 (100B). For example, the parts connected to one face of the backboard 40 constitute the CL #1 (100A), and the CL #2 (100B) is similarly constituted in the side of the other face.

The backboard 40 face, except for the frame part 49, is broadly divided into an upper-half area "a" and a lower-half area "b". The area "a" includes an area which includes connectors or the like and data signal wiring, and an area "c" which serves as a power feed unit in the vicinity of the center. The area "b" includes an area which includes connectors or the like and data signal wiring, and an area "d" which serves as a power feed unit which is in the vicinity of the lowest side. An area "e" represents an example of a connecting position of one logical PK 10 which is shown in FIG. 4. An area "f" represents part of the area in which the bus bar 50 intersects with the data signal wiring below it in the area "c". An area "g" shows an example of data signal cross wiring which is corresponding to the above described mutual connection between four logical PKs.

The backboard 40 is a logical platter for forming the DKC 100 and has the frame part 49 and a substrate layer. On the substrate surface, connectors or the like (41 and 51) for connecting the logical PKs 10, data signal wiring for mutual connection of the parts including the logical PKs 10, etc. are mounted. In addition, in the space above the substrate surface, the bus bar 50 comprising a three dimensional structure which serves as a power feed unit for the units including the logical PK 10 is mounted.

In the areas "c" and "d", the bus bars 50 which serve as power feed units for the logical PK 10 are provided, and data signal cross wiring or an open area is provided below the bas bar 50 of the area "c". The three-dimensional bus bars 50 {50A and 50B} are mounted on the backboard 40. Taking influence of the power supply noise into consideration, the bus bar 50 is connected and fixed such that a gap distance is reserved between the data signal wiring of the backboard 40 face and the bus bar 50 face, i.e., the power feed wiring. In the area "c", the bus bar 50 serves as one power feed unit for a plurality of the logical PKs 10 connected to the area "a" and comprises two bus bars 50A and 50B serving as main bodies, a plurality of power feed connectors 51 and the locator pins 52 mounted on the face thereof, etc. Both end portions of the bus bar 50 are fixed to the frame part 49 by screw fastening parts 53, and several portions thereof are fixed to the substrate surface by the spacers 45. Onto the bus bars 50, the power feed connectors 51 for supplying power to the logical PKs 10 and the locator pins 52 for ensuring connection position accuracy are connected and fixed by means of screw fastening. The area "d" is configured in a similar manner.

DC power is supplied from the power control board 24 of the power source unit of the disk array system 1 to the bus bars 50 which serve as the power feed units of the backboard 40 through predetermined power feed wiring. Then, in the power feed units, through the power feed wiring of grounds and power sources which is provided by the main bodies of the bus bars 50A and 50B, and via the power feed connectors 51 on the bus bars 50 and then via power feed connectors 71 of the logical PKs 10 which are connected thereto, DC power is supplied into the corresponding logical PKs 10.

The data signal wiring shown in FIG. 3 is corresponding to a mounting system in which the DKC 100 is formed by mutual connection of the logical PKs 10. The upper and the lower areas "a" and "b" have data signal wiring which is in a form of straight lines in the lateral direction between the connectors 41, and data signal wiring which is in a form of cross wiring between the upper and the lower areas "a" and "b" (area "c"). The present embodiment is particularly corresponding to a type of buses in which the logical PKs 10 are mutually connected and perform communication via switching units (SW). In this bus type, for example, as shown in the right half area, to the logical PKs 10 serving as switching units (represented by areas "e"), a plurality of other logical PKs 10 having functions of, for example, the CHA 11 and the CM 13 is connected by the buses, i.e., the lateral data signal wiring. In addition, between the upper and the lower areas "a" and "b", the logical PKs 10 of the switching units are connected with each other by the buses, i.e., the vertical data signal wiring (cross wiring). In this type, communication between the logical substrates is performed through path switching control at the switching units. If no switching units are provided in the configuration, as shown in the left half area, between the upper and the lower areas "a" and "b", the logical substrates are mutually connected by the data signal wiring (cross wiring). In this type, communication between the logical substrates is performed without the intermediation of the switching units.

The area "e" includes one main edge connector 41 and one power feed connector 51. The main edge connector (also referred to simply as a connector) 41 is a connector relating to data signal communication in the backboard 40 side. The power feed connector 51 is a connector relating to power feed from the bus bar 50 to the logical PK 10 in the backboard 40 side.

The data signal cross wiring shown in the areas "f" and "g" connects the connectors 41 between the upper and the lower areas "a" and "b", and is wiring three-dimensionally intersecting with the bus bar 50 of the power feed wiring. Note that actual wiring is not exactly like the arrows, but is an area having width corresponding to necessary amount of lines.

In the configuration of the present embodiment, the logical PK 10 connected to the backboard 40 is divided into halves being compared with a conventional one, and they are connected in the upper and the lower areas "a" and "b", respectively. Therefore, a power feed unit has to be provided in the area "c" which is near the center of the backboard 40 face, and data signal cross wiring has to be provided between the upper and the lower areas "a" and "b". This is achieved by forming the power feed unit by the bus bar 50, and later described problems of, for example, influence of power supply noise is also solved.

<Logical PK>

In FIG. 4, the logical PK 10 has the parts, to which power is to be supplied such as a main edge connector 61, a power feed connector 71, a locator pin receiver 72, an LSI (semiconductor integrated circuit device) 62 serving as a processor, data-signal simple wiring (a), power feed wiring, and a DC-DC converter 63. The logical PK 10 is about half of the illustrated conventional logical PK 910 in terms of shape and functions. If the logical PK 10 is, for example, a CHA-PK, eight channels of I/F ports are provided per package as shown by dotted lines. A communication cable is connected to the I/F port, thereby enabling communication between the CHA 11 and an external device. Also other logical PKs 10 are provided with necessary parts such as a memory, etc. according to the processing function thereof.

Data-signal simple wiring such as that shown in the area "a" is provided between the main edge connector 61 and the LSI 62. Power feed wiring or a power layer corresponding thereto is provided between the power feed connector 71 and the parts, to which power is to be supplied such as the DC-DC converter 63. The power feed connector 71 and the locator pin receiver 72 are provided at the cut portion 70 having a shape corresponding to the connection with the three-dimensional bus bar 50.

In the architecture of the DKC 100, in order to ensure the performance and reliability, the logical PKs 10 each of which having one LSI 62 are connected to the upper and the lower areas "a" and "b" in the vertical direction of the backboard 40 face. Data signal wiring is simple wiring in the logical PK 10 side, and has cross wiring in the backboard 40 side. Therefore, the processor (LSI 62) of each logical PK 10 can communicate with the logical PKs 10 of both the upper and lower areas "a" and "b" of the backboard face 40.

<Logical Box>

Figure 5:
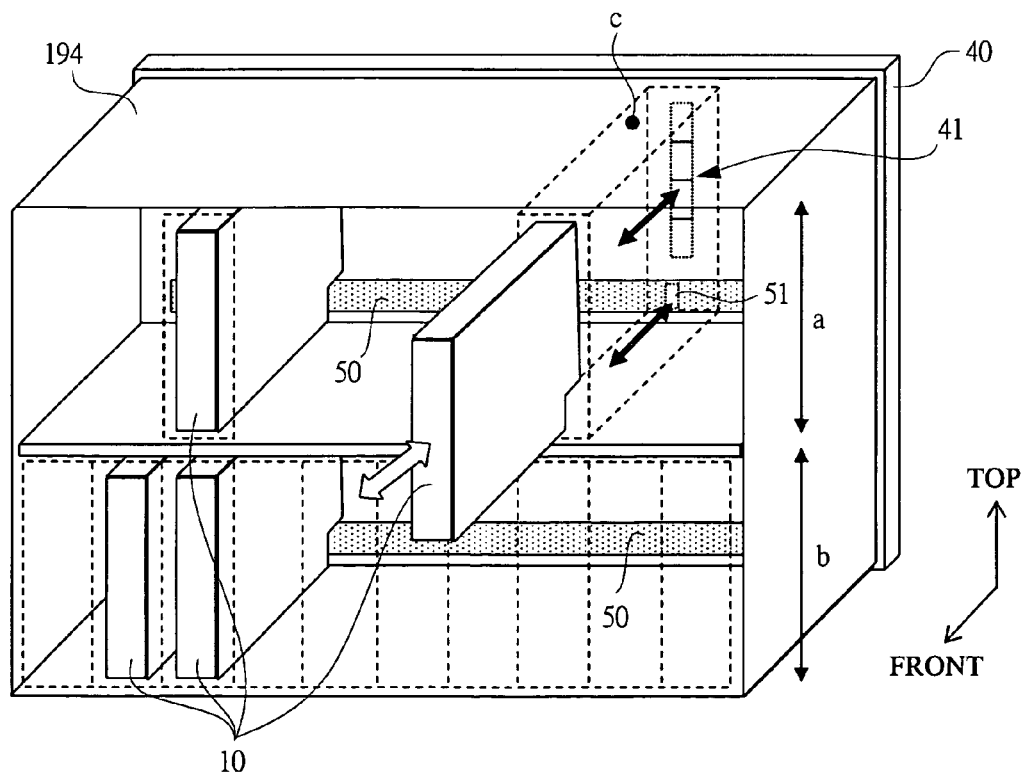
FIG. 5 is a drawing showing a connection state of the logical packages with respect to a logical box in the disk array system of the first embodiment of the present invention.

FIG. 5 is an explanatory view showing a connection state by insertion and removal of the logical PKs 10 with respect to the logical box 194 and the backboard 40. The logical box 194 at the front face of the system, the front face of the backboard 40, and the logical PKs 10 are shown in a simplified manner. Herein, the shape of the logical PK 10 is shown as a shape which is approximately cuboid, and a part thereof is a cut portion (70) which is corresponding to the connection with the bus bar 50. The actual structure and shape of the logical PK 10 is corresponding to the mechanical structure and shape of a slot.

The logical box 194 has a plurality of slots which are capable of housing the logical PKs 10 in parallel in the upper and the lower space areas ("a" and "b"). Each of the logical PKs 10 is housed in and connected to each slot such that it can be inserted thereto and removed therefrom, therefore replacement can be performed in unit of the logical PK 10. According to the functions and performance required in the system including the disk array system 1, the necessary types of the logical PKs 10 provided in a necessary number are connected. For example, upon system change or failure of the logical PKs 10, they are replaced with other logical PKs 10.

When the logical PK 10 is to be inserted and attached, as shown in FIG. 5 at a slot (C), the logical PK 10 is inserted to an opening, which is in the front side of the logical box 194 and corresponding to a slot, along guide rails in the slot. Then, in the slot, the connectors (61 and 71) of the logical PK 10 side are connected with the corresponding connectors (41 and 51) in the backboard 40 side which is at the back, so as to be in a fixed state. Accordingly, the connection of the logical PK 10 is detected, and it is incorporated into the system configuration as a part of the DKC 100. When the logical PK 10 is to be removed and taken out, the logical PK 10 in the slot is removed, by means of the part of, e.g., the canister thereof, along the guide rails, thereby causing the connectors (41 and 51) to be in a disconnected state. Accordingly, the disconnection of the logical PK 10 is detected, and it is eliminated from the system configuration. Although unillustrated, the parts for supporting and fixing the logical PKs 10 in the slots and the parts for readily taking out the logical PKs 10 may be provided in the configuration.

The plurality of logical PKs 10 share the same specification of the outer shape thereof, the manner of the connection with the logical box 194 and the backboard 40, etc., except for that of the processing functions provided by each logical PK 10. Systems required by customers can be flexibly built by combinations of the logical PKs 10. Particularly, combinations of the logical PKs 10 which are according to the half-divided specification can form, for example, a system having reduced unused I/F ports and other unused functions and a system having a combination of multiple types of I/F ports and other functions.

In addition, according to this specification, in the upper and the lower areas ("a" and "b") of the logical box 194, all of the plurality of logical PKs 10 are inserted and connected in the same direction. Since the specification and the manner of attachment of the plurality of logical PKs 10 are uniform, in terms of maintenance, errors such as erroneous connection of the packages can be prevented. The logical PKs 10 connected in the upper and the lower areas ("a" and "b") can communicate with one another via the connector units including the data-signal cross wiring on the backboard 40 face.

<Connection and Bus Bar>

FIG. 6 is a perspective view showing a state of connection of the logical PKs 10 with the backboard 40 and showing the three-dimensional structures of the bus bars 50. The left half of the backboard 40 is shown. When the logical PK 10 is to be inserted with respect to the backboard 40 in the slot, first, the locator pin 52 which is in the backboard 40 side is connected into the locator pin receiver 72 which is in the logical PK 10 side. Then, the connectors (41 and 61) are mutually connected, and the power feed connectors (51 and 71) are mutually connected. The size of the cut portion 70 is designed to match the size of the bus bar 50. The material of the locator pin 52 is not particularly limited.

The bus bar 50 can be produced by, for example, forming of copper frames. In the present example, the main body of the bus bar 50 has a shape of a straight bar of which end portions are bent in a step-like manner, wherein the bar has a width and a thickness which provide a cross sectional area corresponding to the supply current. As long as a distance can be reserved between the bus bar 50 and the backboard 40 face, the bus bar 50 may have a different shape. The main bodies {50A and 50B} of the bus bar 50 and the power feed connectors 51 are electrically connected. The end portions of the bus bar 50 main bodies and the power feed wiring from the power control board 24 are electrically connected. The part of the bus bar 50 surface other than these electrically connected parts is insulated. The end portions of the bus bar 50 are, for example, electrically connected with power feed wiring provided in the frame part 49, and further, electrically connected to the power feed wiring which is from the power source unit. Alternatively, the end portions of the bus bar 50 may be directly connected with the power feed wiring which is from the power source unit.

When it is configured such that the thickness of the frame of the bus bar 50 main body in the direction perpendicular to the backboard 40 face is increased or reduced, the supply current can be increased or reduced. Compared with the means which increases the number of power layers in the substrate internal layers of the backboard 40, the means which increases the thickness of the frame of the bus bar 50 main body is easier to realize. For example, the thickness of the frame of the bus bar 50 can be formed to 6 mm by utilizing conventional techniques. Accordingly, the frame becomes capable of handling power feed of a current up to 150 amperes. Also, without changing the thickness of the bus bar 50, the length of the bus bar 50 in the width direction may be changed. The number of the same type of the bus bars 50 may be increased so as to increase the total cross sectional area of the bus bars 50, thereby increasing the supply current. Also, according to the specification of the supply current, three or more bus bars corresponding to various power sources may be formed.

<Connection of Power Feed Connector and Locator Pin>

Figure 7B:
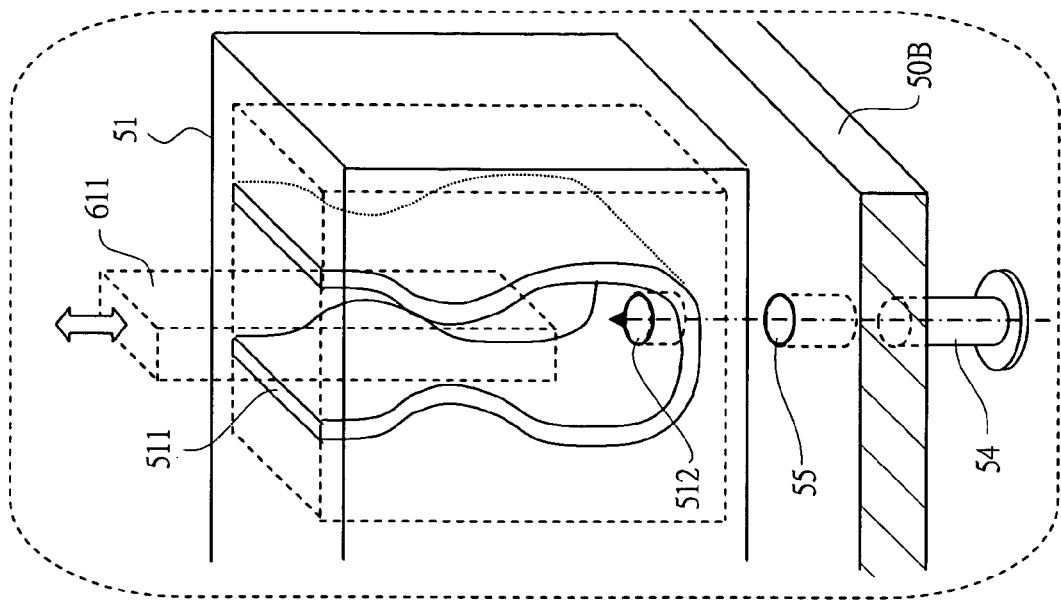
FIG. 7B is a drawing showing details of a mounting configuration of a power feed connector and a locator pin with respect to a bus bar in the disk array system of the first embodiment of the present invention.
Figure 7A:
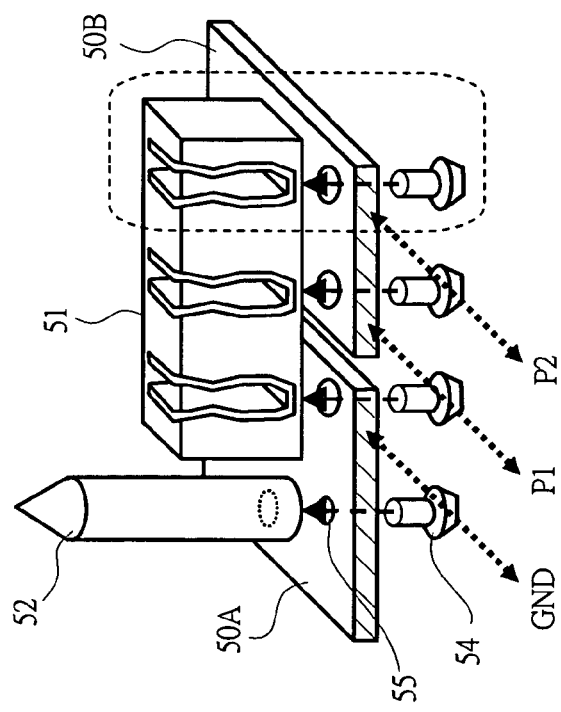
FIG. 7A is a drawing showing details of a mounting configuration of a power feed connector and a locator pin with respect to a bus bar in the disk array system of the first embodiment of the present invention.

FIGS. 7A and 7B show details of a mounting configuration of the power feed connector 51 and the locator pin 52 which are on the bus bar 50. FIG. 7A shows attachment of one power feed connector 51 and the locator pin 52 on the bus bar 50 corresponding to connection of one logical PK 10. FIG. 7B shows details of screw fastening of a connector part (pin receiver) which is corresponding to one power source type in the power feed connector 51 of FIG. 7A. This example employs a mounting system in which, unlike conventional methods, newly, a plurality of the power feed connectors 51 and the locator pins 52 are fixed and connected to predetermined positions on the upper faces of the bus bars 50A and 50B, respectively, by means of screw fastening.

In FIG. 7A, the bus bar 50A side has the locator pin 52 and a pin receiving part for ground (represented by GND) wiring. The locator pin 52 and the connector part are fixed to the screw holes 55 of the bus bar 50A by screws 54. The bus bar 50B side has pin receiving parts for wiring of power sources (represented by P1 and P2). Similarly, the connector part is fixed to screw holes 55 of the bus bar 50B by screws 54. The wiring of the ground (GND) and the power sources (P1 and P2) have to be separated, therefore a slight gap is provided between the two bus bars 50A and 50B.

The locator pin 52 is provided, since high positioning accuracy is required at the connecting position according to the type of the connectors (41, 51, 61, and 71). In the connecting operation of the logical PK 10, first, the locator pin 52 is brought into contact with and engaged with the locator pin receiver 72 which is corresponding thereto.

In FIG. 7B, each of the connector parts of the power feed connector 51 has a screw hole 512 in the bottom surface thereof in a manner corresponding to the screw hole 55 of the bus bar 50. Screw-fastening to the screw hole 55 and the screw hole 512 is made by the screw 54. In the connection between the power feed connectors (51 and 71), when a pin receiver 511 of the power feed connector 51 of the bus bar 50 side comes into contact with a pin 611 of the power feed connector 71 of the logical PK 10 side, an electrically conducted state is obtained. Note that the shapes of the pin receiver 511 and the pin 611 meet the connector standards.

Methods other than screw fastening may be adopted for mounting of the power feed connector 51 and the locator pin 52 on the bus bar 50. It may be configured such that the power feed connector 51, etc. are integrally formed with the bus bar 50 from the beginning.

<Connection of Bus Bar and Spacer>

Figure 8A:
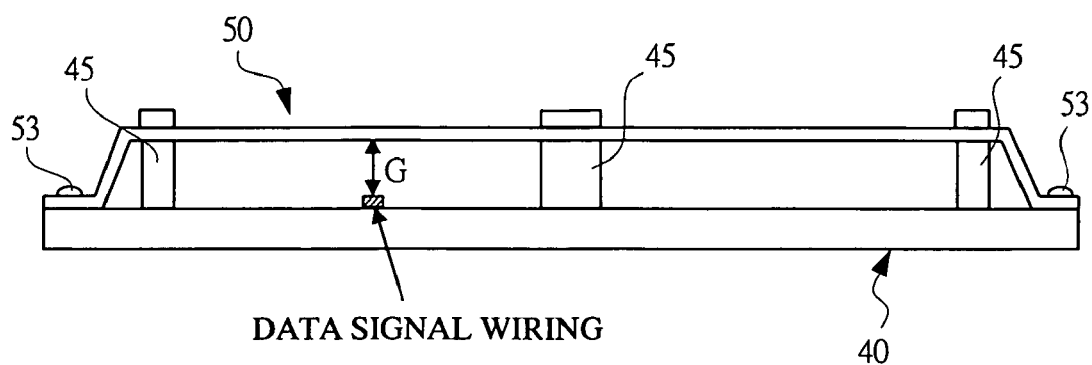
FIG. 8A is a drawing showing details of a mounting configuration of a bus bar and spacers with respect to the backboard face in the disk array system of the first embodiment of the present invention.
Figure 8B:
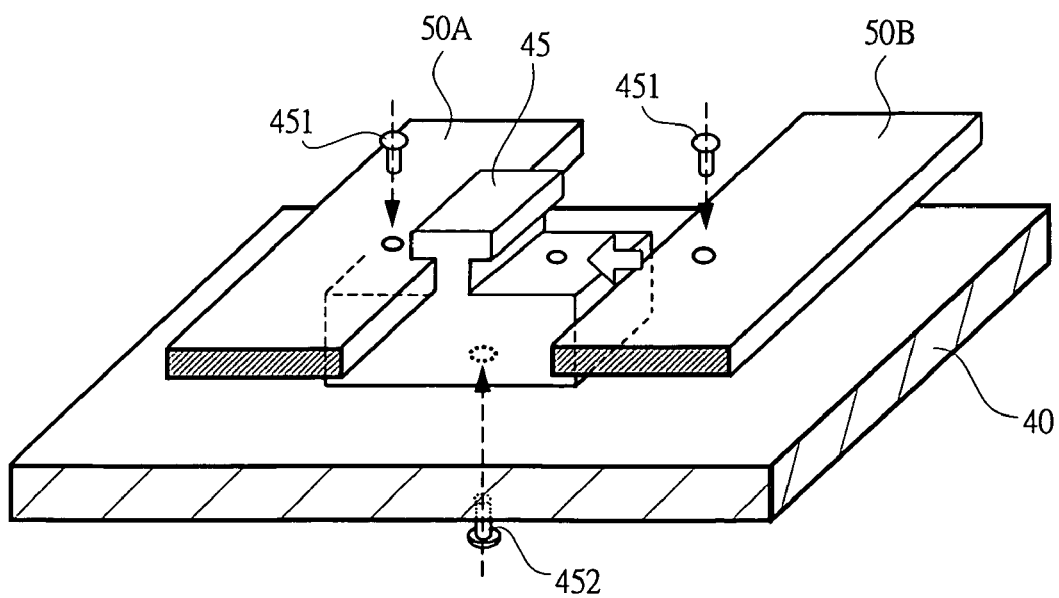
FIG. 8B is a drawing showing details of a mounting configuration of a bus bar and spacers with respect to the backboard face in the disk array system of the first embodiment of the present invention.

FIGS. 8A and 8B show details of a mounting configuration of the bus bar 50 and the spacer 45 with respect to the backboard 40 face. FIG. 8A is a drawing of the connection state of the bus bar 50 and the spacer 45 with respect to the face of the backboard 40 viewed from the horizontal direction of the backboard 40 face. Herein, illustration of the power feed connector 51, etc. on the bus bar 50 is omitted. FIG. 8B shows attachment of one spacer 45 to a part of the bus bar 50.

In FIG. 8A, at the screw-fastening portions 53, both end portions of the bus bar 50 are connected with and fixed to the frame part 49 of the backboard 40 by means of screw fastening. Other than the screw-fastening parts 53, the spacers 45 are attached between the bus bar 50 and the backboard 40 face by means of, for example, screw-fastening. This example shows a case in which the spacers 45 are attached at three positions, i.e., near the both end portions and at the center of the bus bar 50. The spacer 45 is formed of, for example, plastic as an insulating material. G represents a gap distance between the data signal wiring on the backboard 40 face and the lower face of the bus bar 50.

In FIG. 8B, the spacer 45 has a shape for mutually connecting the two bus bars 50A and 50B and the backboard 40 face. When the spacer 45 is attached, the positioning accuracy of the bus bar 50 with respect to the backboard 40 face in the vertical and horizontal directions is improved. When the gap distance (G) is fixed, the influence of power supply noise of the power feed wiring of the bus bar 50 on the data signal wiring becomes constant.

Attaching method of the units is, for example, as the following. An operator interposes the spacers 45 between the two bus bars 50A and 50B, and fixes them by means of screw fastening using screws 451. Next, as shown in above mentioned FIGS. 7A and 7B, the power feed connectors 51 and the locator pins 52 are fixed on the bus bar 50 by means of screw fastening. Then, the bus bar 50 to which the necessary parts has been attached is fixed with respect to the face of the backboard 40 by means of screw fastening using the screw-fastening parts 53 at the frame part 49 and screws 452 at the spacers 45. Note that, for example, if the positioning accuracy can be sufficiently ensured by the screw-fastening parts 53 at the end portions of the bus bar 50, the spacers 45 are not required to be attached.

<Power Supply Noise Influence and Supply Current Increase According to Distance>

FIG. 9 shows a simulation model for examining the power supply noise influence according to the gap distance between the bus bar 50 serving as the power feed wiring and the data signal wiring. FIG. 10 shows a graph of simulation results according to the model of FIG. 9.

In FIG. 9, the simulation model is as the following. Regarding the gap distance (G) between the data signal wiring of the backboard 40 and the bus bar 50, the design specification of the cross talk coefficient between the power feed wiring and the data signal wiring is set to 0.05 or less which is required often in general. Herein, cross talk is interference or erroneous signals due to noise generated by the adjacent wiring, and a cross talk coefficient represents the level thereof. In the backboard 40, FR-4 represents a substrate product having a dielectric constant of 4.4 and a thickness of 0.1 mm. A solid ground (GND) layer made of copper has a thickness of 0.035 mm. The data signal wiring made of copper on FR-4 of the backboard 40 has a width of 0.13 mm. The bus bar 50 which is positioned above the data wiring and made of copper has a thickness of 0.8 mm and a width of 5.0 mm.

It can be understood from the graph of FIG. 10 that, in order to make the cross talk coefficient 0.05 or less, the gap distance (G) has to be at least 3.0 mm. It can be understood that, for example, if the power feed wiring and the data signal wiring are closely provided, as shown in FIG. 10, the cross talk coefficient significantly increases particularly when G is 1 mm or less. In that case, erroneous signals are likely to be generated in the data signal wiring due to the influence of power supply noise. Generally, the narrower the gap distance from the power feed wiring, the more the cross talk coefficient increases.

In the configuration of this example, at least 3.0 mm of the gap distance (G) is reserved by the three-dimensional structure of the bus bar {50A and 50B} so as to meet the above described design specification. Accordingly, the influence of power supply noise on the data signal wiring can be satisfactory suppressed and erroneous signals can be also prevented.

In a conventional disk array system, power feed is performed with a voltage of at least 48 V to at most 56 V. As a specification change, a configuration in which power feed is performed with a lower voltage (greater current) is required. The present disk array system 1 employs a specification in which the power supply system thereof corresponds to power feed which is performed with a voltage of, for example, at least {3.3 V to 5 V} to at most 12V. For example, if the working voltage is reduced to 12 V, according to an employed specification, from a conventional voltage of 48 V, the working current is increased to four times the conventional current. Specifications of the power system other than those described above may be implemented by changing the cross sectional area of the bus bar 50.

In the present embodiment, increase of the supply current is implemented by the bus bar 50 but not by increasing the number of the substrate internal layers of the backboard 40. When the working current of the power supply system is increased to a current which is greater than a conventional current, accordingly, the power supply noise influence also increases. As a result, erroneous signals are likely to be generated in the data signal wiring. When the specification of the bus bar 50 and the gap distance (G) are determined correspondingly to the configuration of the increased large current, the influence of the power supply noise can be sufficiently suppressed.

<Effects>

In the present embodiment, since the data signal wiring can be provided in the area below the bus bar 50 on the backboard 40 face, the number of the data signal wiring lines in the backboard 40 can be increased so as to provide high-density wiring. In addition, since the power feed wiring can be provided by the bus bar 50, high-density wiring can be provided by increasing the number of power feed wiring in the power feed unit of the backboard 40. In addition, since the influence of power supply noise of the power feed wiring which is provided by the bus bar 50 on the data signal wiring of the backboard 40 face can be sufficiently suppressed and a low-impedance bus bar can be realized, power dispatching which is more stable than that in a mode in which the power feed wiring is formed by backboard internal layers can be realized. Also, it is no longer needed to provide power feed wiring by use of multiple layers of the substrate internal layers of the backboard 40. In addition, specification change of the power supply system such as increase of the supply current can be flexibly implemented by, for example, changing the cross sectional area of the bus bar 50.

As one means of avoiding power feed wiring which is provided in the backboard face, or realizing logical PKs which are divided into halves, a configuration in which power feed units are provided in the upper and lower areas in the vicinity of the outer periphery of the backboard face can be employed. For example, the backboard is configured such that the power feed unit of the area "c" of the backboard 940 face of FIG. 12 is provided in the vicinity of the frame part 949 of the area "a" in the manner similar to the power feed unit of the area "d". And, corresponding to this, logical PKs which have been divided into halves in the manner of FIG. 4 are configured to be connected to the upper and the lower areas "a" and "b". However, in this case, when the half-divided logical PKs are to be inserted and connected to the slots of the areas "a" and "b", the logical PKs have to be turned around in the vertical direction, and the operator has to pay attention to the direction of the logical PKs. Therefore, erroneously oriented logical PKs may be inserted to the slots due to carelessness. In that case, for example, erroneous connection, buckling, etc. of connector pins occur between the connectors of the logical PKs and the backboard. Accordingly, failure of the PKs is caused and data signals remain in a disconnected state. As a result, failure of bus obstruction in the mutual connection buses between the logical PKs and a one-CL down state are caused, which is crucial in terms of reliability.

While in the present embodiment, since uniformly-oriented logical PKs 10 can be inserted and connected to the slots of the upper and the lower areas "a" and "b", the above described erroneous connection and failure is not caused, and it has a great advantage of excellent maintainability. When the inserting/removing direction, the outer shape, etc. of the plurality of the logical PKs 10 for forming the DKC 100 are caused to be in a unified form, it is also advantageous in terms of production cost.

<Other Embodiments>

The following can be provided as another embodiment of the present invention. FIG. 11 is a drawing showing a brief overview of a configuration of a logical PK 90 which is in the disk array system 1 of another embodiment of the present invention. In the present embodiment, the three-dimensional bus bar is applied to the logical PK. The logical PK to which it is applied is not limited to the logical PK 10 having the configuration like that as shown in above mentioned FIG. 4.

The logical PK 90 has, in addition to the parts to which power is supplied such as the main edge connector 61, the power feed connector 71, the LSI 62 serving as a processor, data signal wiring, power feed wiring, and the DC-DC converter 63, etc. a bus bar 80. In this configuration, the three-dimensional bus bar 80 serving as power feed wiring is provided above the logical substrate face of the logical PK 90. The bus bar 80 is a three dimensional structure which is produced through forming of a copper frame, and is provided so as to let the power feed wiring intersect, above the data signal wiring with a distance therebetween, with the data signal wiring which is on the logical substrate face. The data signal wiring is provided, for example, between the main edge connector 61 and the LSI 62. The power feed wiring provided by the bus bar 80 is provided between the parts to which power is to be supplied, such as the power feed connector 71 and the DC-DC converter 63, such that the power feed wiring intersects with the data signal wiring. The data signal wiring is prioritized to be provided on the logical substrate face, and the bus bar 80 is used for providing wiring in the area where intersection with the power feed wiring is needed. The shape of the bus bar 80 is, for example, similar to that of the above describe bus bar 50, and end portions thereof are fixed to the logical substrate face by means of, for example, screw fastening. In the manner similar to the above described embodiment, the working current and the cross talk coefficient are taken into consideration for determining the specification and the gap distance (G) of the bus bar 80. However, in the present embodiment, other parts such as spacers like the above described spacers 45 are not particularly required to be provided between the bus bar 80 and the logical substrate face. According to the present configuration, in the logical PK 90, the influence of the power supply noise between the data signal wiring and the power feed wiring can be fixed and suppressed, thereby realizing stable power dispatching.

Moreover, in another embodiment, the configuration is not limited to that in which the logical PKs 10 are connected in two rows in the vertical direction of the backboard 40 face, and a similar configuration comprising multiple rows may be employed.

Moreover, in another embodiment, according to the specification of the DKC 100 and the logical PKs, disposal of the bus bar 50 can be performed not only in the area which is in the vicinity of the center of the backboard face. For example, there may be employed a configuration in which one logical PK like the conventional logical PK 910 is connected in the vertical direction of the backboard face, a plurality of the logical PKs are connected in parallel in the lateral direction, power feed units such as the bus bar 50 and the power feed connectors 51 are provided in the lateral direction at any position in the vertical direction of the backboard face, and, corresponding to them, the main edge connectors and the power feed connectors of the logical PK side are provided.

Moreover, in another embodiment, there may be employed a bus bar which has a portion(s) which is, e.g., deformed in the horizontal direction or the vertical direction of the backboard face into a shape other than a straight shape through forming of a copper frame which serves as a material of the bus bar 50. For example, corresponding to prioritized disposal of a part(s), which is not limited to data signal wiring, on the backboard face, the bus bar may have a shape which does not interfere with the part.

Moreover, in another embodiment, for example, there may be employed a mode in which, on the bus bar 50, the locator pins 52 are not provided and merely the power feed connectors 51 are provided, or a power feed wiring dedicated mode in which the power feed connectors 51 are not provided. Moreover, there may be employed a configuration in which the power layer of the backboard and the bus bar are electrically connected so as to provide power feed wiring by the bus bar merely at a part of the backboard face, for example, merely at the part of the data signal cross wiring.

Hereinabove, the invention accomplished by the present inventor has been described in detail according to the embodiments; however, it goes without saying that the present invention is not limited to the above described embodiments, and various modifications can be made without departing from the scope thereof.

The present invention can be utilized for substrates which need data signal wiring and power feed wiring such as substrates (backboard and logical substrates) constituting a storage control device, and for a system which is provided with the substrates.

What is claimed is:

1. A disk array system comprising:
a storage device;
a storage control device; and
a power source unit,
wherein the storage control device comprises a first board for mutual connection, and a plurality of second boards connected to the first board, wherein in each of the second boards installed is a processing function;
wherein the first board includes:
first connectors for connecting the second boards such that data communication can be performed therethrough,
second connectors for connecting the second boards such that power feed can be performed therethrough,
data signal wiring between the first connectors, and
a power feed unit including power feed wiring connected with the second connectors;
wherein the second board includes:
a third connector connected with the first connector of the first board,
a fourth connector connected with the second connector,
a processor for implementing the processing function,
data signal wiring provided between the third connector and the processor, and
power feed wiring provided between the fourth connector and a part to which power is to be fed, wherein power is fed from the power source unit to the power feed unit of the first board, and the power is fed to the second boards through the power feed wiring in the power feed unit and via the second connectors and the fourth connectors; and wherein the power feed wiring of the power feed unit of the first board comprises a bus bar having a three-dimensional structure which reserves a gap distance therefrom to a face of the first board.

2. The disk array system according to claim 1, wherein the gap distance between the three-dimensional structure of the bus bar and the face of the first board is reserved as distance corresponding to at least a value which is calculated in accordance with a specification of materials and sizes of the first board, the bus bar and the data signal wiring, in order to fulfill a specification of a cross talk coefficient regarding power supply noise from the bus bar to the data signal wiring on the face of the first board.

3. The disk array system according to claim 1, wherein, on the face of the first board, the power feed unit is provided in the vicinity of the center thereof in vertical direction and between both end portions thereof in lateral direction, and wherein the data signal wiring is provided on the face of the first board so as to cross the bus bar of the power feed unit at a level below the bar and connect the first connectors mutually, and a face of the bus bar of the power feed unit is provided between the both end portions in the lateral direction with the gap distance provided between the face of the bus bar and a face of the data signal wiring.

4. The disk array system according to claim 1, wherein the second connectors are connected and fixed on an upper face of the bus bar, and wherein power is fed from the power source unit to an end portion of the bus bar, and from the end portion of the bus bar, the power is fed to the second boards through the power feed wiring of the bus bar main body and via the second connectors and the fourth connectors connected thereto.

5. The disk array system according to claim 1, wherein the bus bar is connected and fixed with the first board at the both end portions thereof, is connected for power feeding with the first board at the both end portions, is partially connected for power feeding with the second connectors, and is insulated for the portion except those which are connected for power feeding, and wherein the power feed unit comprises, as the bus bar, two or more bus bars corresponding to a ground and various types of power sources.

6. The disk array system according to claim 5, wherein in the power feed unit, locator pins are connected and fixed on the bus bar corresponding to the ground in order for improving connecting position accuracy between the connectors of the first board side and the connectors of the second board side, and wherein locator pin receivers are attached to the second boards at the positions corresponding to the locator pins.

7. The disk array system according to claim 6, wherein the second connectors and the locator pins are connected and fixed on a face of the bus bar by means of screw fastening.

8. The disk array system according to claim 6, wherein the second board has a structure in which a cut portion having a shape corresponding to a three dimensional structure formed by the first connector on the face of the first board, the bus bar, the second connector, and the locator pin is provided.

9. The disk array system according to claim 1, wherein a spacer made of an insulating material for ensuring positioning accuracy of the bus bar is connected and fixed between the face of the first board and a face of the bus bar by means of screw fastening.

10. The disk array system according to claim 1, wherein the face of the first board includes a plurality of areas divided with respect to the vertical direction each of which has the power feed unit, and a connection area with the second boards including the first connectors and the second connectors on the bus bar;

wherein the plurality of the second boards is inserted with respect to the connection area so as to be connected thereto in parallel in the lateral direction of the face of the first board, and wherein the plurality of second boards is inserted with respect to the connection area in the same direction in the vertical direction of the face of the first board so as to be connected thereto.

11. The disk array system according to claim 10, wherein data signal simple wiring is provided in the second board, and wherein on the face of the first board, data signal wiring is provided so as to mutually connect the first connectors between the upper and lower areas in the vertical direction such that mutual communication between the second boards can be performed.

12. The disk array system according to claim 10, wherein a switch board in which a path switching control function for mutual communication between the second boards is installed is provided as one type of the second boards, wherein in each of the upper and lower areas of the face of the first board, the switch board and the second board corresponding to another processing function are connected by the data signal wiring, and wherein between the upper and lower areas of the face of the first board, the switch boards are mutually connected by the data signal wiring crossing the power feed unit.

13. A disk array system comprising:

a storage device;

a storage control device; and a power source unit, wherein the storage control device comprises a first board for mutual connection, and a plurality of second boards connected to the first board wherein in each of the second boards installed is a processing function, wherein the first board has first connectors for connecting the second boards such that data communication can be performed therethrough, second connectors for connecting the second boards such that power feed can be performed therethrough, data signal wiring between the first connectors, and a power feed unit including power feed wiring connected with the second connectors, wherein the second board has a third connector connected with the first connector of the first board, a fourth connector connected with the second connector, a processor for implementing the processing function, data signal wiring between the third connector and the processor, and power feed wiring between the fourth connector and a part to which power is to be fed, wherein the power feed wiring of the power feed unit of the first board comprises a bus bar comprising a three-dimensional structure except at the parts connected to a face of the first board, which structure reserves a gap distance therefrom to the face of the first board, wherein the bus bar comprises two or more bus bars corresponding to a ground and various types of power sources, wherein the bus bar is connected and fixed with the first board at the both end portions thereof and is connected for power feeding with power feed wiring provided from the power source unit, at a plurality of positions on the upper face thereof, the second connectors are connected and fixed so as to be connected for power feeding and locator pins are connected and fixed, and the portion except for those which are connected for power feeding is insulated, wherein power is fed from the power source unit to the part to which power is to be fed in the second board via the end portion of the bus bar, the bus bar main body, the second connector, and the fourth connector, wherein in the face of the first board, a connection area including the power feed unit, and the first and the second connectors with the second boards is provided in each of two upper and lower areas provided in the vertical direction, the plurality of second boards is inserted so as to be connected in parallel in the lateral direction, and two of the second boards in the vertical direction are inserted in a same direction so as to be connected, wherein the second board has a structure in which a cut portion having a shape corresponding to a three dimensional structure formed by the connection area of the first board side is provided, and data signal simple wiring is provided in the second board, and wherein on the face of the first board, data signal wiring is provided so as to mutually connect the first connectors between the two upper and lower areas such that mutual communication between the second boards can be performed.

14. A disk array system comprising:

a storage device;

a storage control devicer; and a power source unit, wherein the storage control device comprises a first board for mutual connection, and a plurality of second boards connected to the first board wherein in each of the second boards installed is a processing function, wherein the first board has first connectors for connecting the second boards such that data communication can be performed therethrough, second connectors for connecting the second boards such that power feed can be performed therethrough, data signal wiring between the first connectors, and a power feed unit including power feed wiring connected with the second connectors, wherein the second board has a third connector connected with the first connector of the first board, a fourth connector connected with the second connector, a processor for implementing the processing function, data signal wiring between the third connector and the processor, and power feed wiring between the fourth connector and a part to which power is to be fed, wherein power is fed from the power source unit to the power feed unit of the first board, and the power is fed to the second boards through the power feed wiring in the power feed unit and via the second connectors and the fourth connectors, and wherein in the second board, the power feed wiring from the fourth connector to the part to which power is to be fed comprises a bus bar which is obtained by forming of a frame of a conductive material and comprising a three dimensional structure which reserves a gap distance therefrom to a face of the second board.

* * * * *